(12) United States Patent
Ogata et al.

(10) Patent No.: US 12,255,253 B2
(45) Date of Patent: Mar. 18, 2025

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventors: Takahiro Ogata, Himeji Hyogo (JP); Teruyuki Ohashi, Kawasaki Kanagawa (JP); Hiroshi Kono, Himeji Hyogo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 404 days.

(21) Appl. No.: 17/691,008

(22) Filed: Mar. 9, 2022

(65) Prior Publication Data

US 2023/0092171 A1    Mar. 23, 2023

(51) Int. Cl.
*H01L 29/15* (2006.01)
*H01L 29/16* (2006.01)
*H01L 29/78* (2006.01)

(52) U.S. Cl.
CPC ...... *H01L 29/7805* (2013.01); *H01L 29/1608* (2013.01); *H01L 29/7811* (2013.01)

(58) Field of Classification Search
CPC ............. H01L 29/7805; H01L 29/1608; H01L 29/7811; H01L 29/0696; H01L 29/41775;

(Continued)

(56) References Cited

U.S. PATENT DOCUMENTS 10,707,341 B2    7/2020    Nakao et al.
10,734,483 B2    8/2020    Mizukami et al.
(Continued)

FOREIGN PATENT DOCUMENTS

JP    2004-221269 A    8/2004
JP    2016-006854 A    1/2016
(Continued)

OTHER PUBLICATIONS

Office Action issued in Japanese Patent Application No. 2021-154762 dated Jun. 4, 2024 in 16 pages.
(Continued)

*Primary Examiner* — Tan N Tran
(74) *Attorney, Agent, or Firm* — Knobbe, Martens, Olson & Bear, LLP

(57) ABSTRACT

A semiconductor device of embodiments includes: an element region including a transistor and a first diode; a termination region surrounding the element region and including a second diode; and an intermediate region between the element region and the termination region. The element region includes a first electrode, a second electrode, a gate electrode, a silicon carbide layer, and a gate insulating layer. The termination region includes a first wiring layer electrically connected to the first electrode, the second electrode, and the silicon carbide layer. The intermediate region includes a gate electrode pad, a first connection layer electrically connecting the first electrode and a part of the first wiring layer, a second connection layer electrically connecting the first electrode and another part of the first wiring layer, a second wiring layer electrically connected to the gate electrode pad and the gate electrode, and the silicon carbide layer.

14 Claims, 24 Drawing Sheets

(58) Field of Classification Search
CPC ........... H01L 29/42372; H01L 29/4238; H01L 29/7806; H01L 29/7823; H01L 21/823475; H01L 21/823871; H01L 27/0629–0635; H01L 27/0711–0738
USPC .......................................................... 257/77
See application file for complete search history.

(56) References Cited

U.S. PATENT DOCUMENTS

| | | | |
|---|---|---|---|
| 2004/0227163 A1* | 11/2004 | Sakamoto | H01L 29/0692 |
| | | | 257/341 |
| 2011/0109295 A1* | 5/2011 | Minohara | H02M 1/088 |
| | | | 323/311 |
| 2012/0280315 A1 | 11/2012 | Shirai et al. | |
| 2015/0349051 A1 | 12/2015 | Uchida et al. | |
| 2016/0064376 A1* | 3/2016 | Handa | H01L 27/0605 |
| | | | 257/272 |
| 2016/0079411 A1 | 3/2016 | Hino et al. | |
| 2017/0236935 A1* | 8/2017 | Ebihara | H01L 29/7815 |
| | | | 257/77 |
| 2019/0244879 A1 | 8/2019 | Ohoka et al. | |
| 2019/0371936 A1 | 12/2019 | Nagahisa et al. | |
| 2020/0185517 A1 | 6/2020 | Nakao et al. | |
| 2020/0295177 A1 | 9/2020 | Hino et al. | |
| 2020/0312995 A1 | 10/2020 | Nahahisa et al. | |
| 2020/0395440 A1* | 12/2020 | Kubouchi | H01L 29/0623 |
| 2021/0074846 A1 | 3/2021 | Hoshi | |
| 2021/0265498 A1* | 8/2021 | Hsieh | H01L 29/7825 |
| 2021/0288188 A1 | 9/2021 | Ohashi et al. | |
| 2022/0093791 A1* | 3/2022 | Van Brunt | H01L 29/0638 |

FOREIGN PATENT DOCUMENTS

| | | |
|---|---|---|
| JP | 2017-028219 A | 2/2017 |
| JP | 2019-140169 A | 8/2019 |
| JP | 6641488 B2 | 2/2020 |
| JP | 2020-047679 A | 3/2020 |
| JP | 2020-096202 A | 6/2020 |
| JP | 2020-120129 A | 8/2020 |
| JP | 2021-044275 A | 3/2021 |
| JP | 2021-145024 A | 9/2021 |
| WO | WO 2018/037701 A1 | 3/2018 |
| WO | 2019/124378 A1 | 6/2019 |

OTHER PUBLICATIONS

Decision to Grant a Patent issued in Japanese Patent Application No. 2021-154762 dated Dec. 3, 2024 in 7 pages.

* cited by examiner

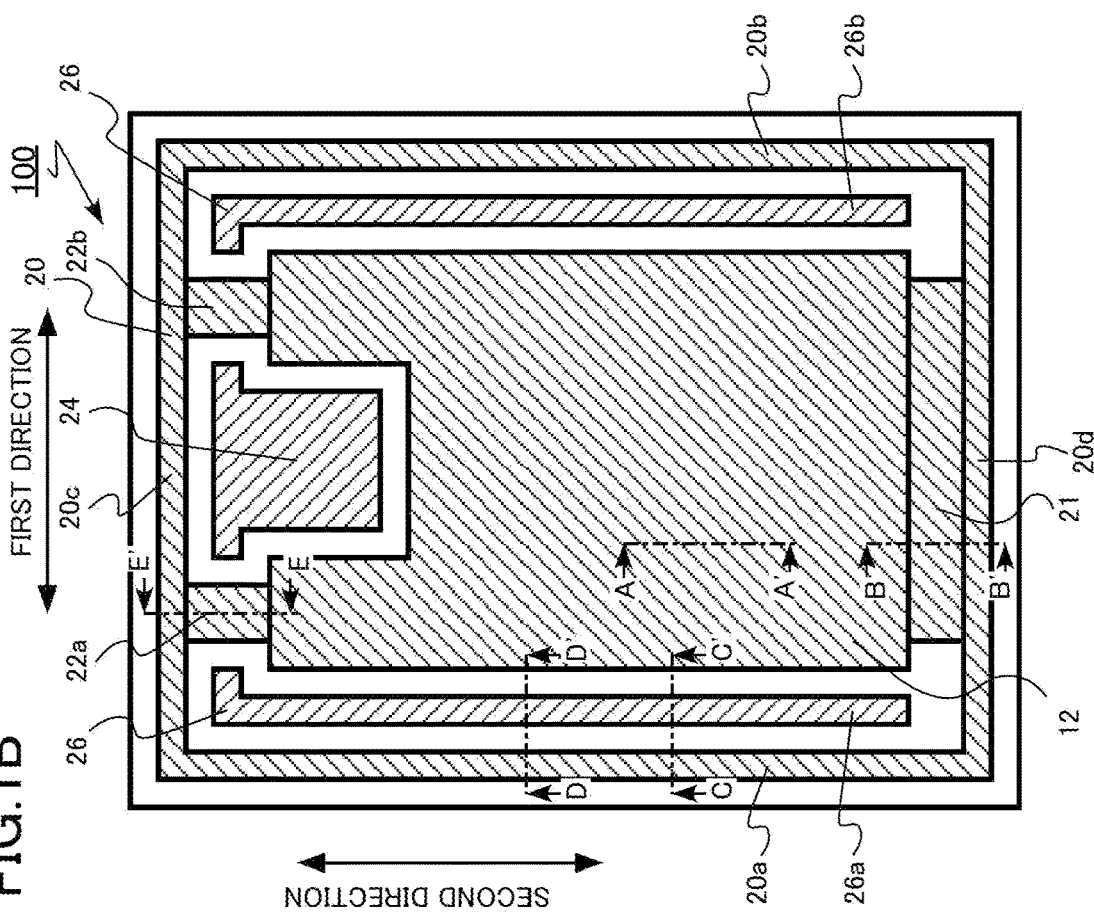
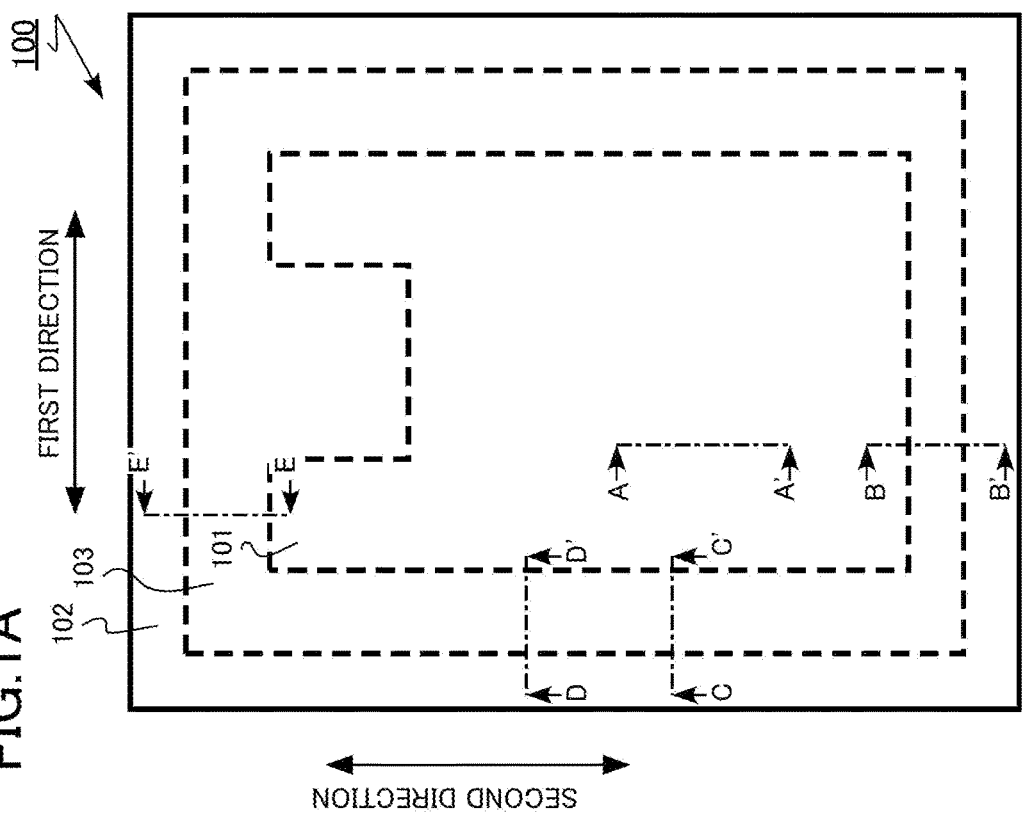

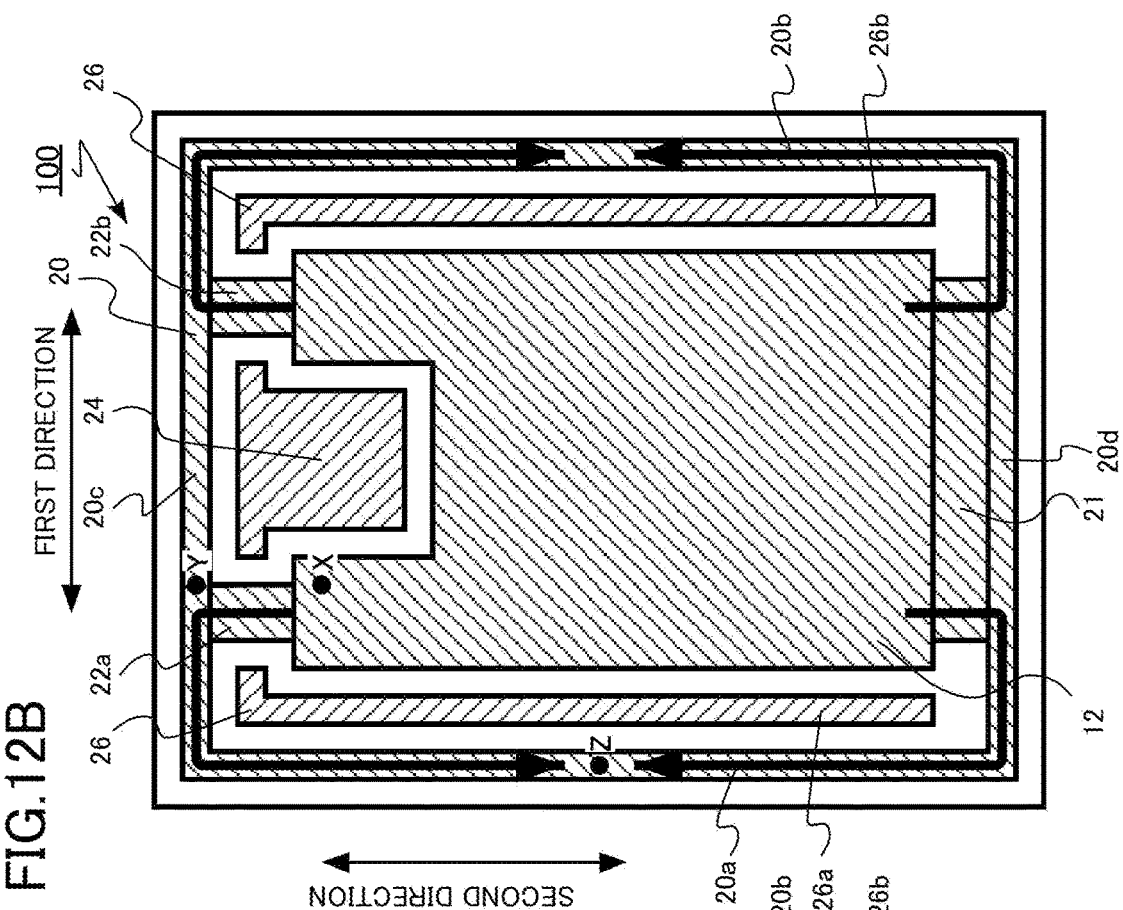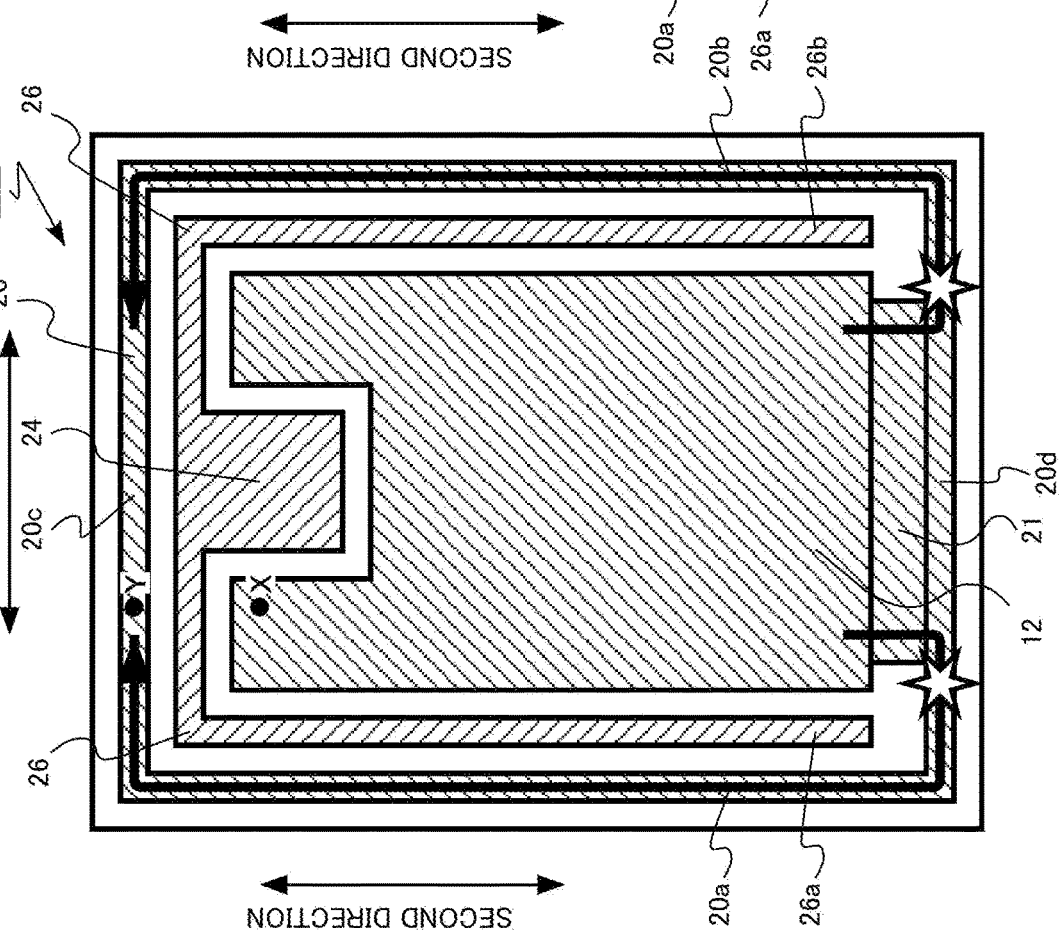

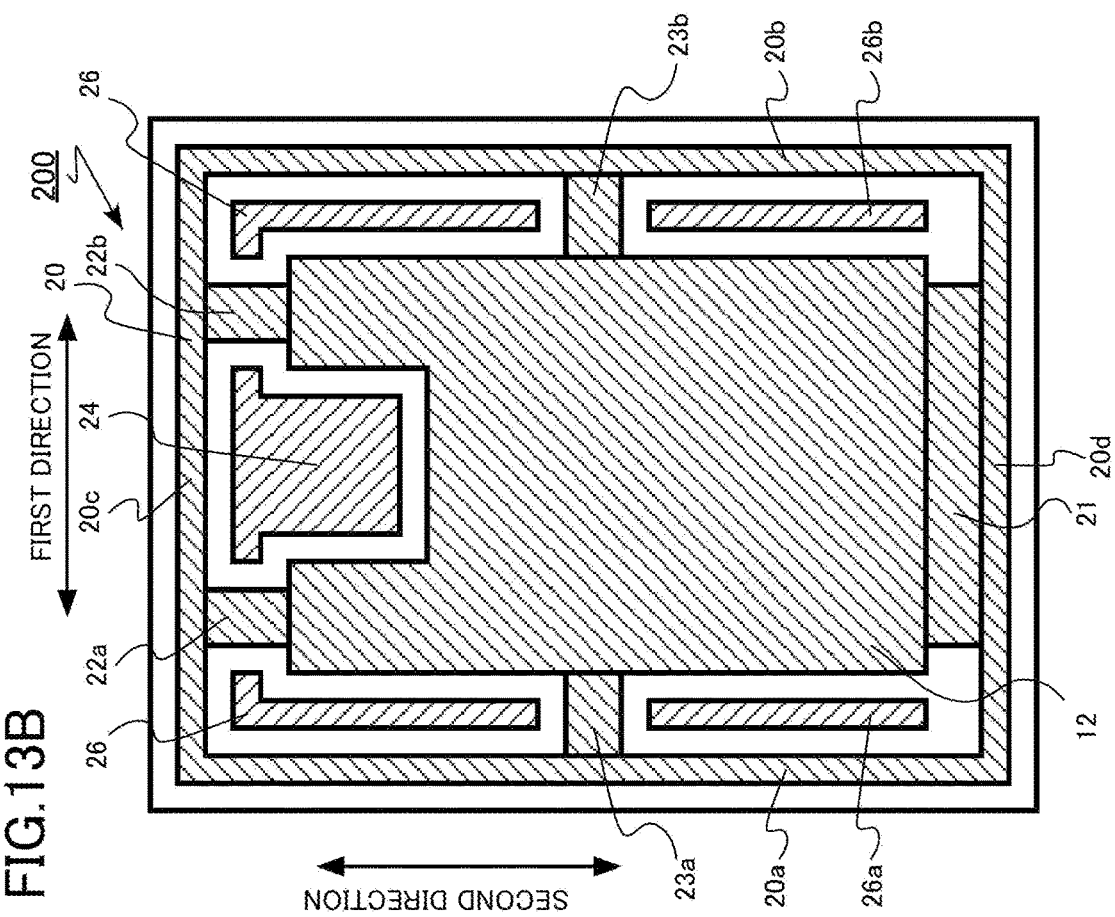
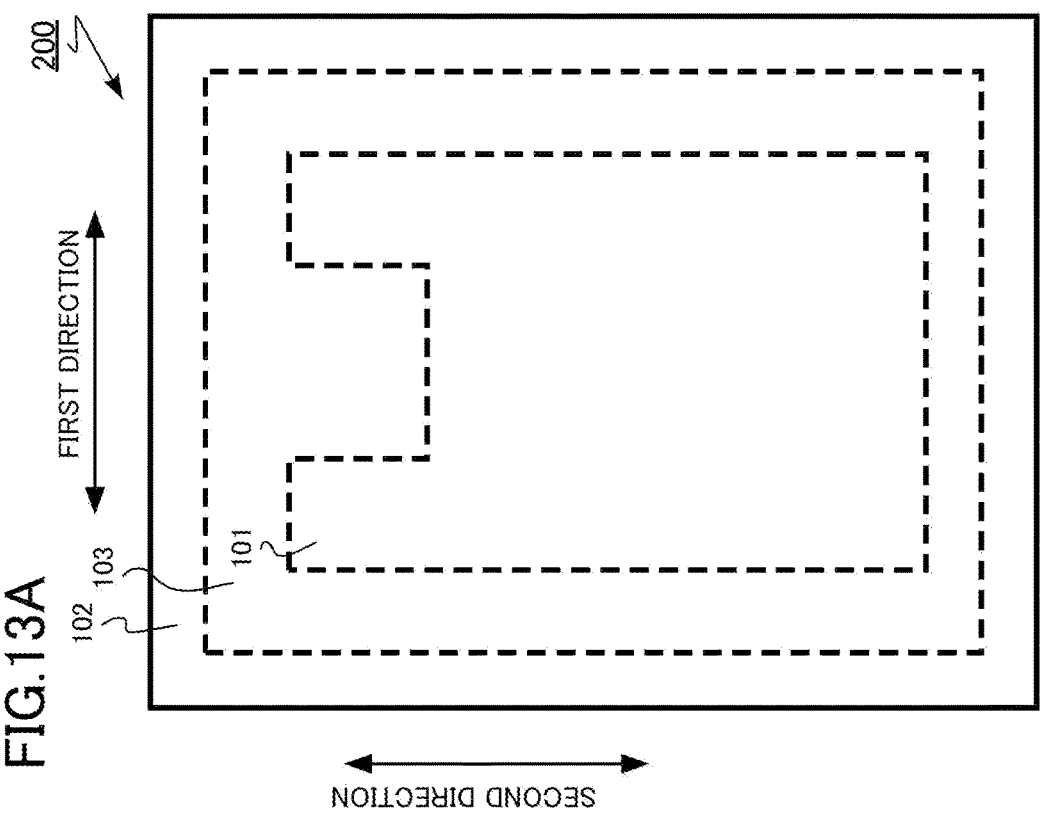

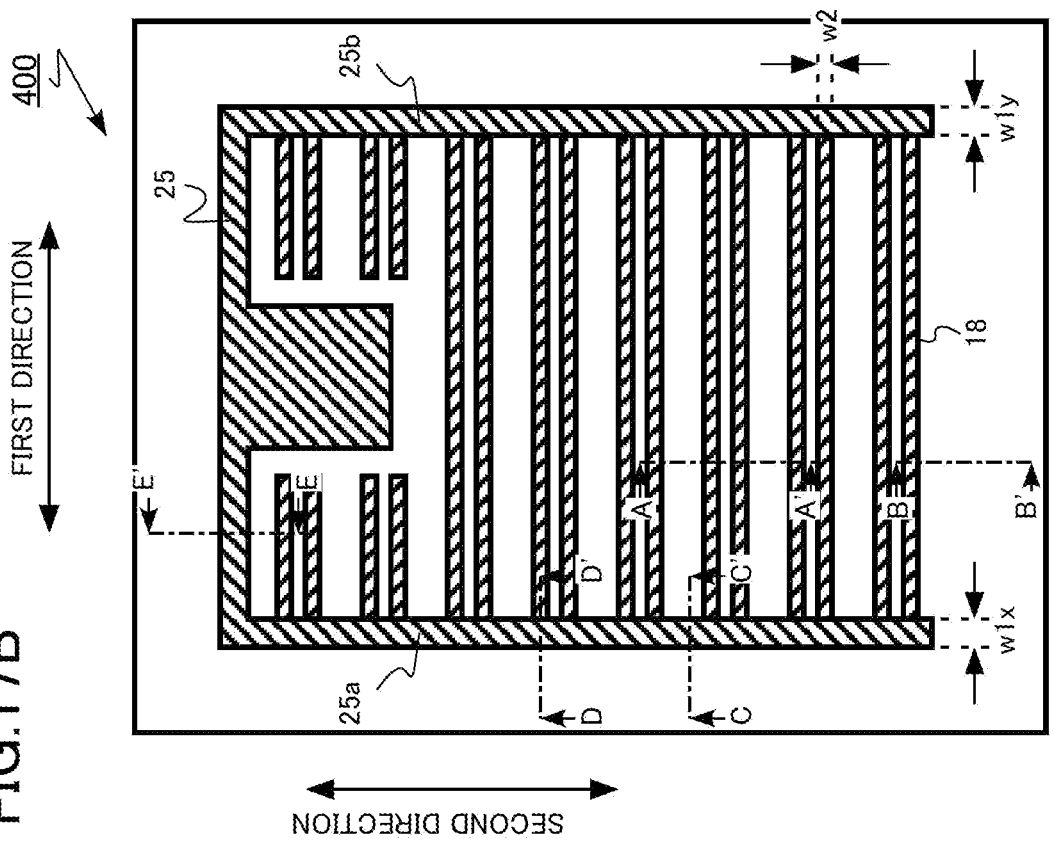
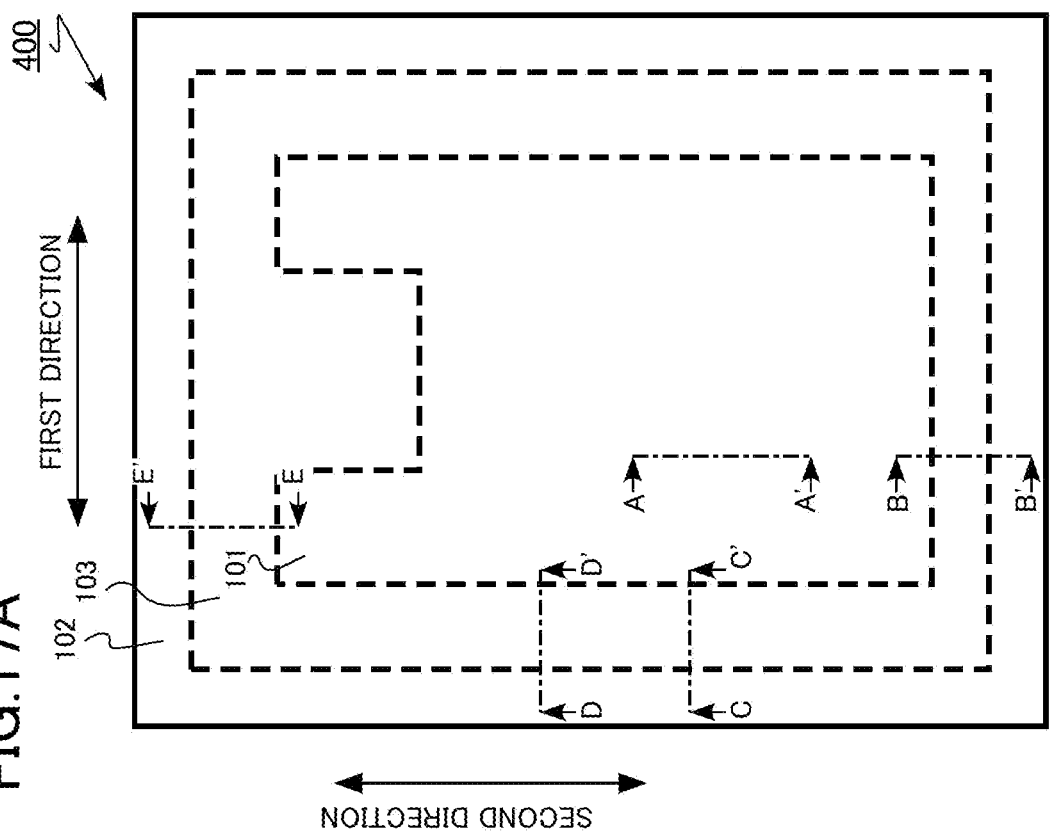

SEMICONDUCTOR DEVICE

CROSS-REFERENCE TO RELATED APPLICATION

This application is based upon and claims the benefit of priority from Japanese Patent Application No. 2021-154762, filed on Sep. 22, 2021, the entire contents of which are incorporated herein by reference.

FIELD

Embodiments described herein relate generally to a semiconductor device.

BACKGROUND

Silicon carbide is expected as a material for next-generation semiconductor devices. Silicon carbide has excellent physical properties, such as a bandgap of about 3 times that of silicon, a breakdown field strength of about 10 times that of silicon, and a thermal conductivity of about 3 times that of silicon. By using such characteristics, for example, it is possible to realize a metal oxide semiconductor field effect transistor (MOSFET) that has a high breakdown voltage and low loss and that can operate at high temperature.

A vertical MOSFET using silicon carbide has a pn junction diode as a built-in diode. For example, a MOSFET is used as a switching element connected to an inductive load. In this case, even when the MOSFET is in the off state, a reflux current can be made to flow by using a pn junction diode.

However, when a reflux current is made to flow by using a pn junction diode that operates in a bipolar manner, a stacking fault grows in a silicon carbide layer due to the recombination energy of the carriers. When the stacking fault grows in the silicon carbide layer, there arises a problem that the on-resistance of the MOSFET increases. Increasing the on-resistance of the MOSFET leads to a reduction in the reliability of the MOSFET. For example, by providing a Schottky barrier diode (SBD) operating in a unipolar manner in the MOSFET as a built-in diode, it is possible to suppress the growth of a stacking fault in the silicon carbide layer.

A high surge voltage may be applied to the MOSFET momentarily beyond the steady state. When a high surge voltage is applied, a large surge current flows to generate heat, destroying the MOSFET. The maximum allowable peak current value of the surge current allowed in the MOSFET is referred to as a surge current withstand capacity. In a MOSFET in which the SBD is provided, it is desired to improve the surge current withstand capacity from the viewpoint of improving reliability.

BRIEF DESCRIPTION OF THE DRAWINGS

FIGS. 1A and 1B are schematic top views of a semiconductor device of a first embodiment;
FIGS. 12A and 12B are explanatory diagrams of the function and effect of the semiconductor device of the first embodiment;
FIGS. 13A and 13B are schematic top views of a semiconductor device of a second embodiment;
FIGS. 17A and 17B are schematic top views of the semiconductor device of the fourth embodiment.

DETAILED DESCRIPTION

Figure 2B:
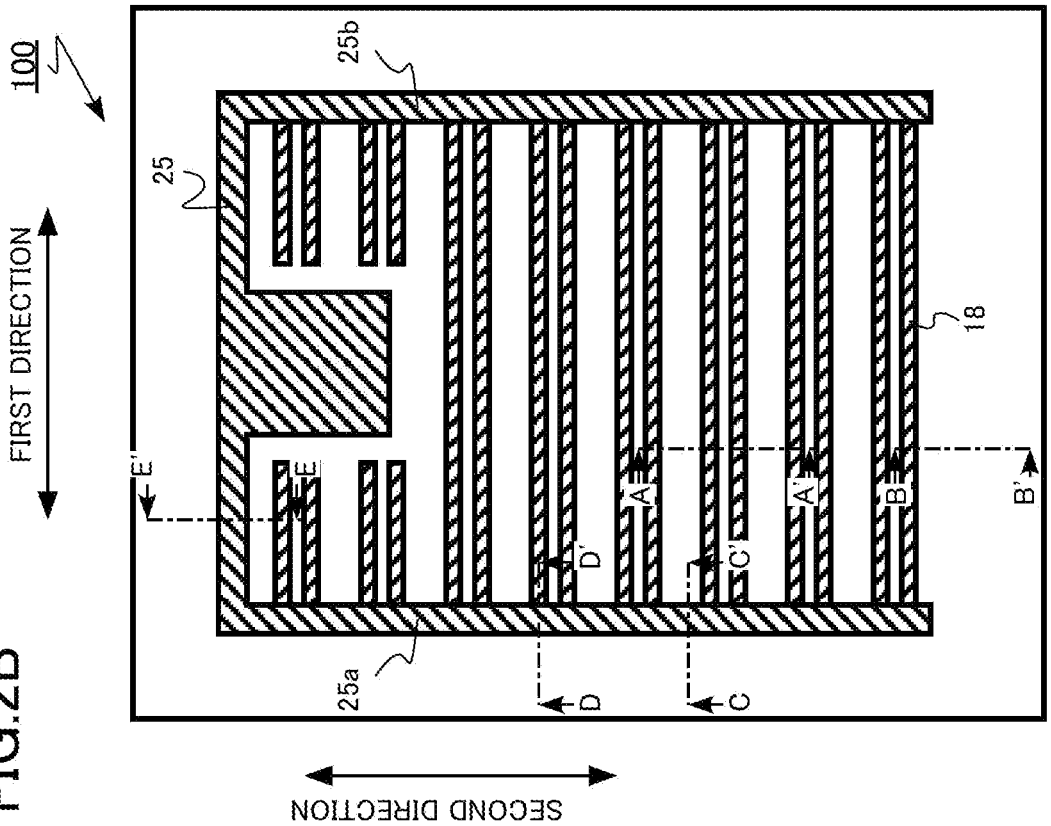
FIGS. 2A and 2B are schematic top views of the semiconductor device of the first embodiment.

A semiconductor device of embodiments includes: an element region including a transistor and a first diode; a termination region surrounding the element region and including a second diode; and an intermediate region provided between the element region and the termination region, the element region includes: a first electrode; a second electrode; a gate electrode; a silicon carbide layer provided between the first electrode and the second electrode, having a first face on a side of the first electrode and a second face on a side of the second electrode, and including: a first silicon carbide region of a first conductive type including a first region and a second region, the first region being in contact with the first face and facing the gate electrode, and the second region being in contact with the first face and in contact with the first electrode; a second silicon carbide region of a second conductive type provided between the first silicon carbide region and the first face, the second silicon carbide region being adjacent to the first region, the second silicon carbide region facing the gate electrode, and the second silicon carbide region electrically connected to the first electrode; and a third silicon carbide region of a first conductive type provided between the second silicon carbide region and the first face and electrically connected to the first electrode; and a gate insulating layer provided between the gate electrode and the second silicon carbide region and between the gate electrode and the first region, the termination region includes: a first wiring layer electrically connected to the first electrode, the first wiring layer including a first portion, a second portion, a third portion, and a fourth portion, the first portion extending in a second direction perpendicular to a first direction parallel to the first face, the second direction being parallel to the first face, the second portion extending in the second direction, the third portion extending in the first direction, the fourth portion extending in the first direction, the first electrode being interposed between the first portion and the second portion and between the third portion and the fourth portion; the second electrode; and the silicon carbide layer including the first silicon carbide region and a fourth silicon carbide region of a second conductive type, the first silicon carbide region including a third region, the third region being in contact with the first face and in contact with the first wiring layer, the fourth silicon carbide region provided between the first silicon carbide region and the first face and electrically connected to the first wiring layer, and the intermediate region includes: a gate electrode pad; a second wiring layer electrically connected to the gate electrode pad and the gate electrode and including a first line and a second line, the first line extending in the second direction and provided between the first portion and the first electrode, and the second line extending in the second direction and provided between the second portion and the first electrode; the second electrode; a first connection layer electrically connecting the first electrode and the fourth portion to each other; and a second connection layer electrically connecting the first electrode and the third portion to each other.

Hereinafter, embodiments will be described with reference to the diagrams. In the following description, the same or similar members and the like may be denoted by the same reference numerals, and the description of the members and the like once described may be omitted as appropriate.

In addition, in the following description, when there are notations of $n^+$, n, $n^-$, $p^+$, p, and $p^-$, these notations indicate the relative high and low of the impurity concentration in each conductive type. That is, $n^+$ indicates that the n-type impurity concentration is relatively higher than n, and $n^-$ indicates that the n-type impurity concentration is relatively lower than n. In addition, $p^+$ indicates that the p-type impurity concentration is relatively higher than p, and $p^-$ indicates that the p-type impurity concentration is relatively lower than p. In addition, $n^+$-type and $n^-$-type may be simply described as n-type, $p^+$-type and $p^-$-type may be simply described as p-type.

In addition, unless otherwise specified in this specification, the "impurity concentration" means a concentration when the impurity concentration of the opposite conductive type is compensated for. That is, the n-type impurity concentration in an n-type silicon carbide region means a concentration obtained by subtracting the concentration of p-type impurities from the concentration of n-type impurities. In addition, the p-type impurity concentration in a p-type silicon carbide region means a concentration obtained by subtracting the concentration of n-type impurities from the concentration of p-type impurities. In addition, unless otherwise specified in this specification, the "impurity concentration in the silicon carbide region" is a maximum impurity concentration in the corresponding silicon carbide region.

The impurity concentration can be measured by, for example, time of flight-secondary ion mass spectrometry (TOF-SIMS). In addition, the relative high and low of the impurity concentration can be determined from, for example, the high and low of the carrier concentration obtained by scanning capacitance microscopy (SCM). In addition, the distance such as the depth and thickness of an impurity region can be calculated by, for example, the TOF-SIMS. In addition, the distance such as the depth, thickness, and width of an impurity region and a spacing between impurity regions can be calculated from, for example, a composite image of an SCM image and an atomic force microscope (AFM) image.

In addition, the width of the wiring can be measured by using, for example, a scanning electron microscope (SEM) or a transmission electron microscope (TEM). In addition, the electrical resistance or sheet resistance of the wiring can be calculated, for example, based on the resistivity of the material configuring the wiring. In addition, the electrical resistance or sheet resistance of the wiring can be calculated, for example, based on the direct measurement of the wiring resistance.

First Embodiment

A semiconductor device of a first embodiment includes: an element region including a transistor and a first diode; a termination region surrounding the element region and including a second diode; and an intermediate region provided between the element region and the termination region and not including the transistor, the first diode, and the second diode. The element region includes: a first electrode; a second electrode; a gate electrode; a silicon carbide layer provided between the first electrode and the second electrode, having a first face on a side of the first electrode and a second face on a side of the second electrode, and including: a first silicon carbide region of a first conductive type having a first region in contact with the first face and facing the gate electrode and a second region in contact with the first face and in contact with the first electrode; a second silicon carbide region of a second conductive type provided between the first silicon carbide region and the first face, adjacent to the first region, facing the gate electrode, and electrically connected to the first electrode; and a third silicon carbide region of a first conductive type provided between the second silicon carbide region and the first face and electrically connected to the first electrode; and a gate insulating layer provided between the gate electrode and the second silicon carbide region, between the gate electrode and the first region, and between the gate electrode and the third silicon carbide region. The termination region includes: a first wiring layer electrically connected to the first electrode and having a first portion extending in a second direction perpendicular to a first direction parallel to the first face and parallel to the first face, a second portion extending in the second direction, a third portion extending in the first direction, and a fourth portion extending in the first direction, the first electrode being interposed between the first portion and the second portion and between the third portion and the fourth portion; the second electrode; and the silicon carbide layer including the first silicon carbide region having a third region in contact with the first face and in contact with the first wiring layer and a fourth silicon carbide region of a second conductive type provided between the first silicon carbide region and the first face and electrically connected to the first wiring layer. The intermediate region includes: a gate electrode pad; a second wiring layer electrically connected to the gate electrode pad and the gate electrode and having a first line extending in the second direction and provided between the first portion and the first electrode and a second line extending in the second direction and provided between the second portion and the first electrode; the second electrode; a silicon carbide layer including the first silicon carbide region and a fifth silicon carbide region of a second conductive type provided between the first silicon carbide region and the first face; a first connection layer for electrically connecting the first electrode and the fourth portion to each other; and a second connection layer for electrically connecting the first electrode and the third portion to each other. The transistor includes the gate electrode, the gate insulating layer, the first region, the second silicon carbide region, and the third silicon carbide region. The first diode includes the first electrode and the second region. The second diode includes the first wiring layer and the third region.

FIGS. 1A and 1B are schematic top views of the semiconductor device of the first embodiment. FIG. 1A shows a layout pattern of an element region, a termination region, and an intermediate region. FIG. 1B shows a layout pattern of a first electrode, a first wiring layer, a first connection layer, a second connection layer, a gate pad electrode, and a second wiring layer.

Figure 2A:
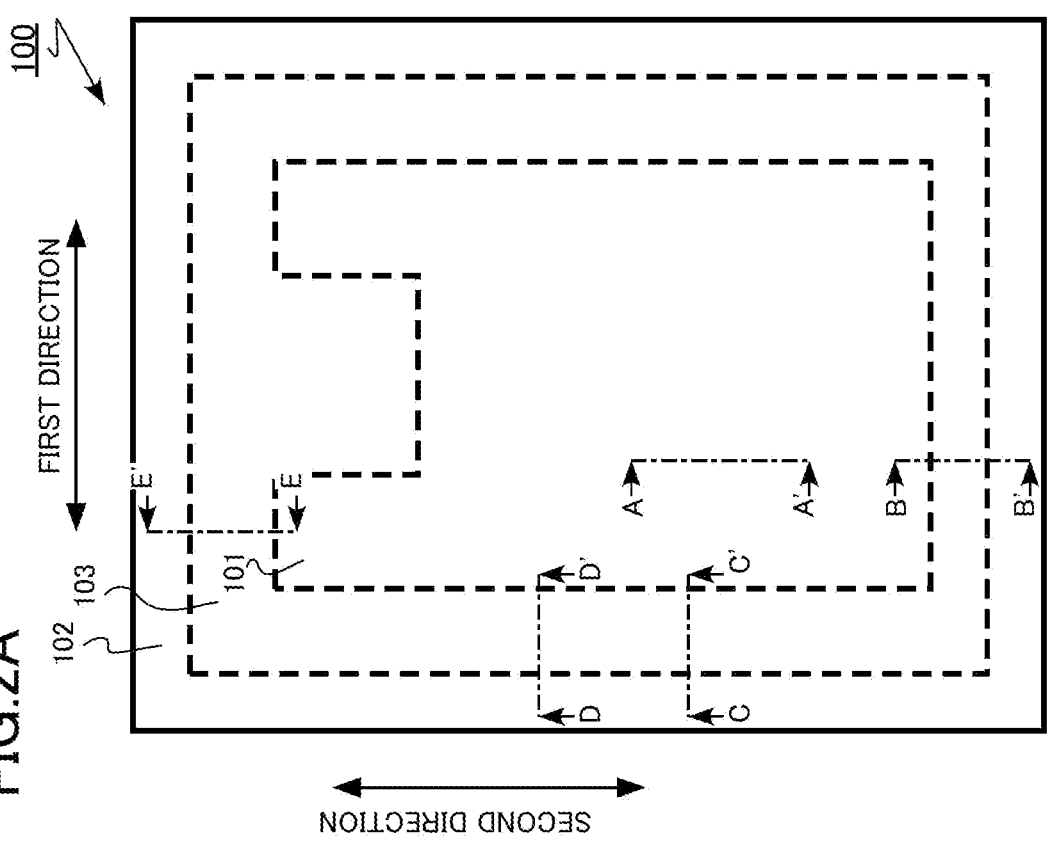

FIGS. 2A and 2B are schematic top views of the semiconductor device of the first embodiment. FIG. 2A shows a layout pattern of an element region, a termination region, and an intermediate region. FIG. 2B shows a layout pattern of a gate electrode, a gate wiring layer, and a gate pad electrode.

Figure 3:
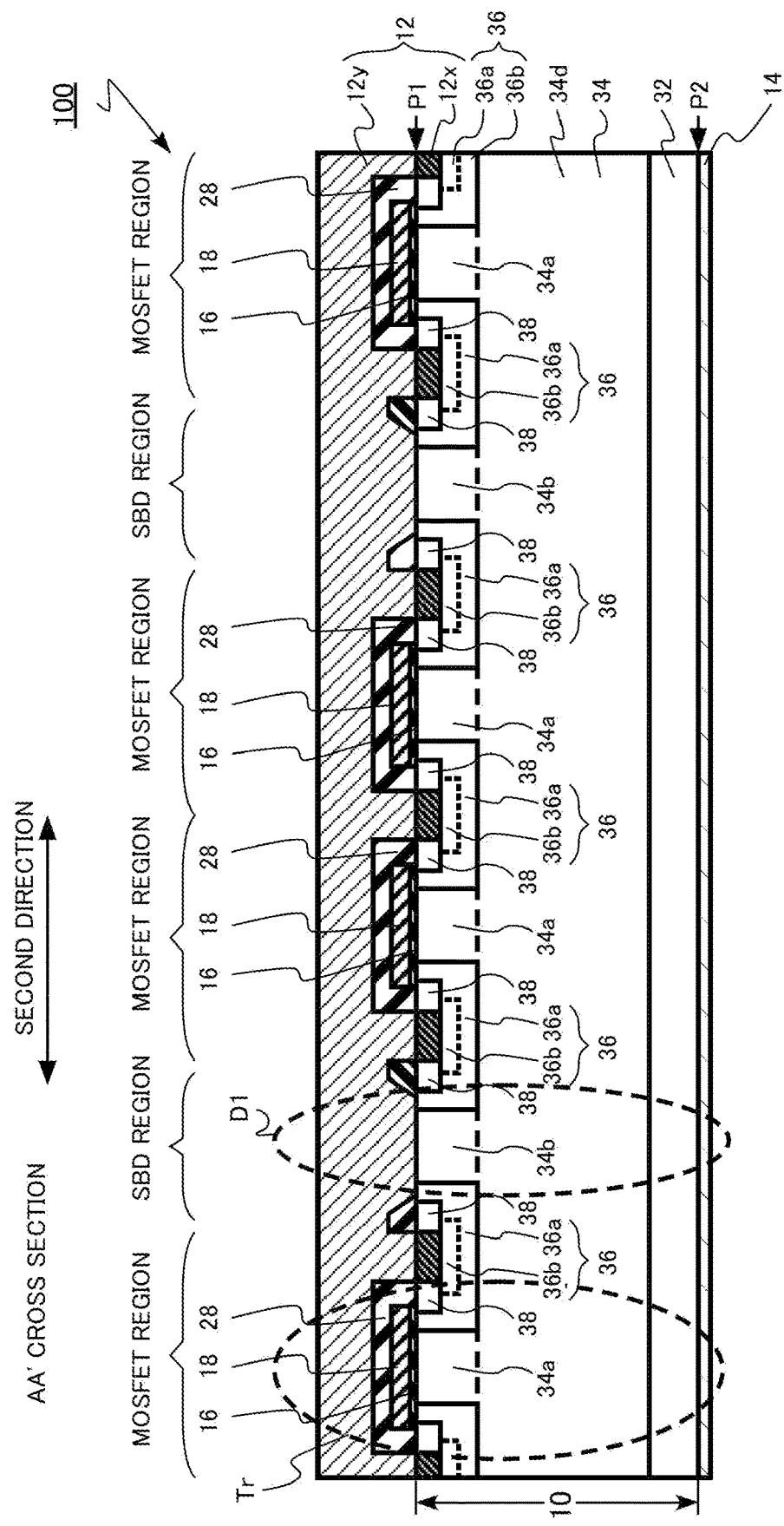
FIG. 3 is a schematic cross-sectional view of the semiconductor device of the first embodiment.

FIG. 3 is a schematic cross-sectional view of the semiconductor device of the first embodiment. FIG. 3 is a cross-sectional view taken along the line AA' of FIGS. 1A, 1B, 2A, and 2B.

Figure 4:
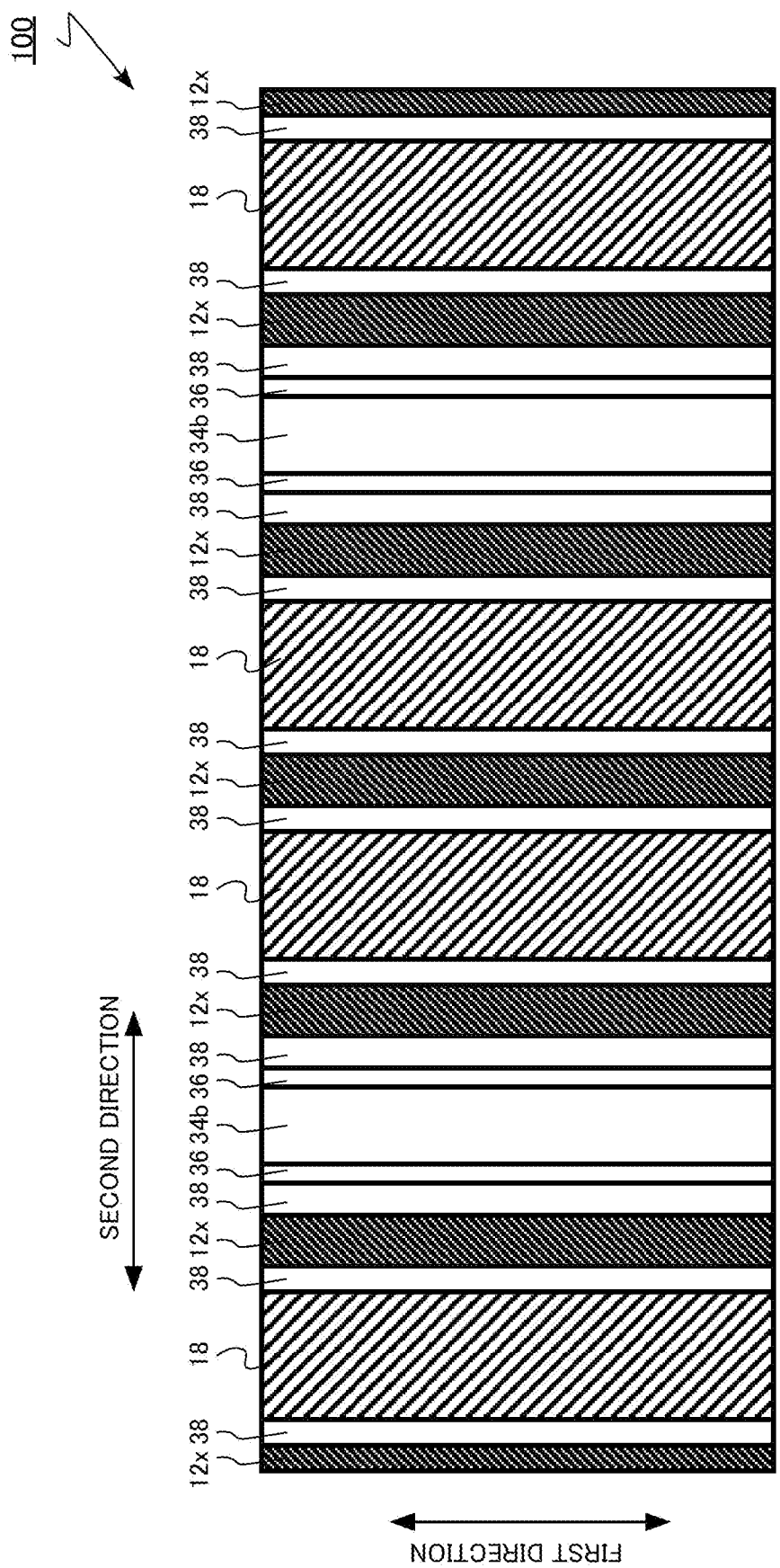
FIG. 4 is a schematic top view of the semiconductor device of the first embodiment.

FIG. 4 is a schematic top view of the semiconductor device of the first embodiment. FIG. 4 is a top view corresponding to FIG. 3. FIG. 4 shows a layout pattern on the side of a first face of a semiconductor layer. FIG. 4 shows a state in which a first electrode and an interlayer insulating layer are removed.

Figure 5:
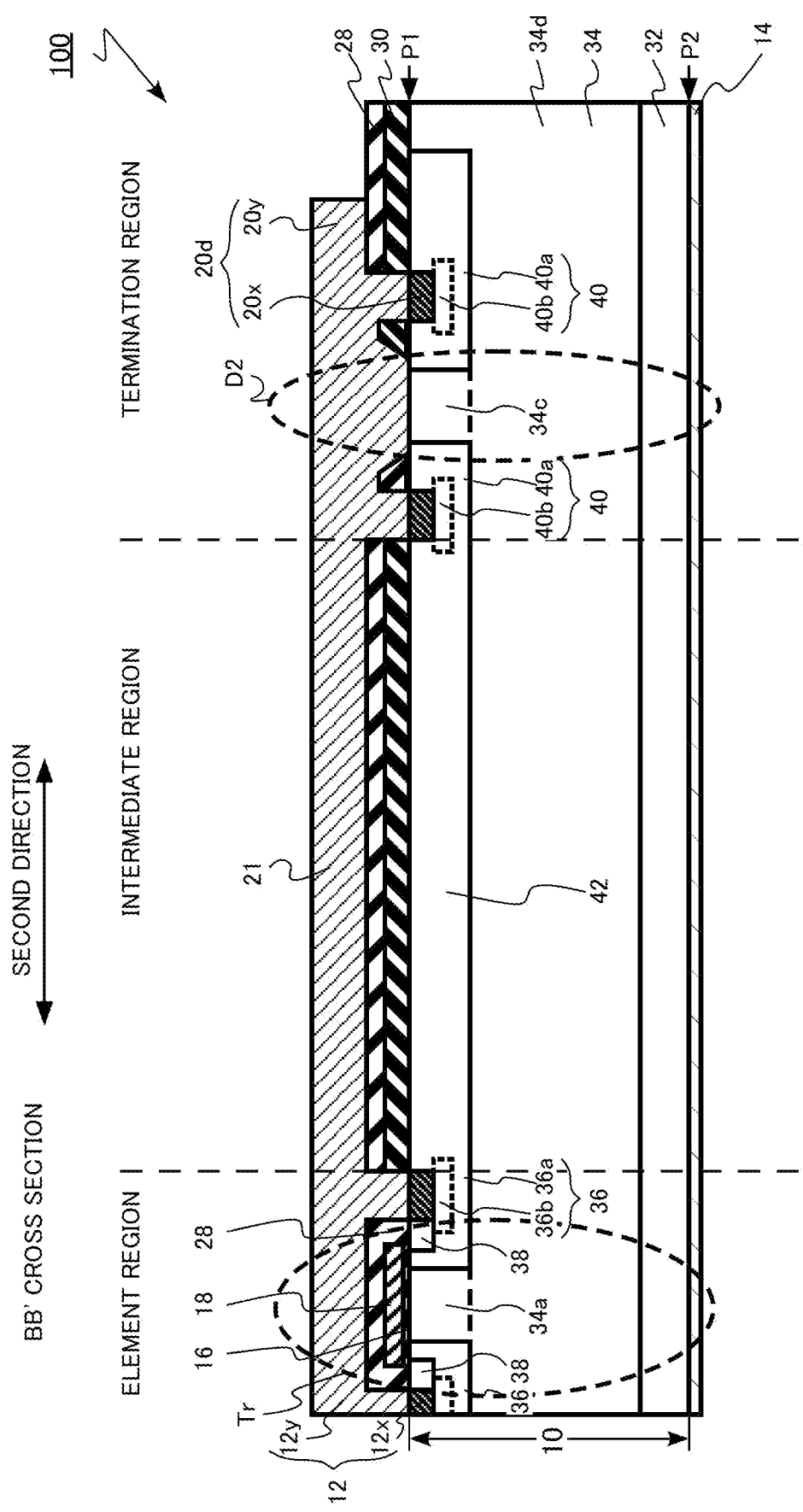
FIG. 5 is a schematic cross-sectional view of the semiconductor device of the first embodiment.

FIG. 5 is a schematic cross-sectional view of the semiconductor device of the first embodiment. FIG. 5 is a cross-sectional view taken along the line BB' of FIGS. 1A, 1B, 2A, and 2B.

Figure 6:
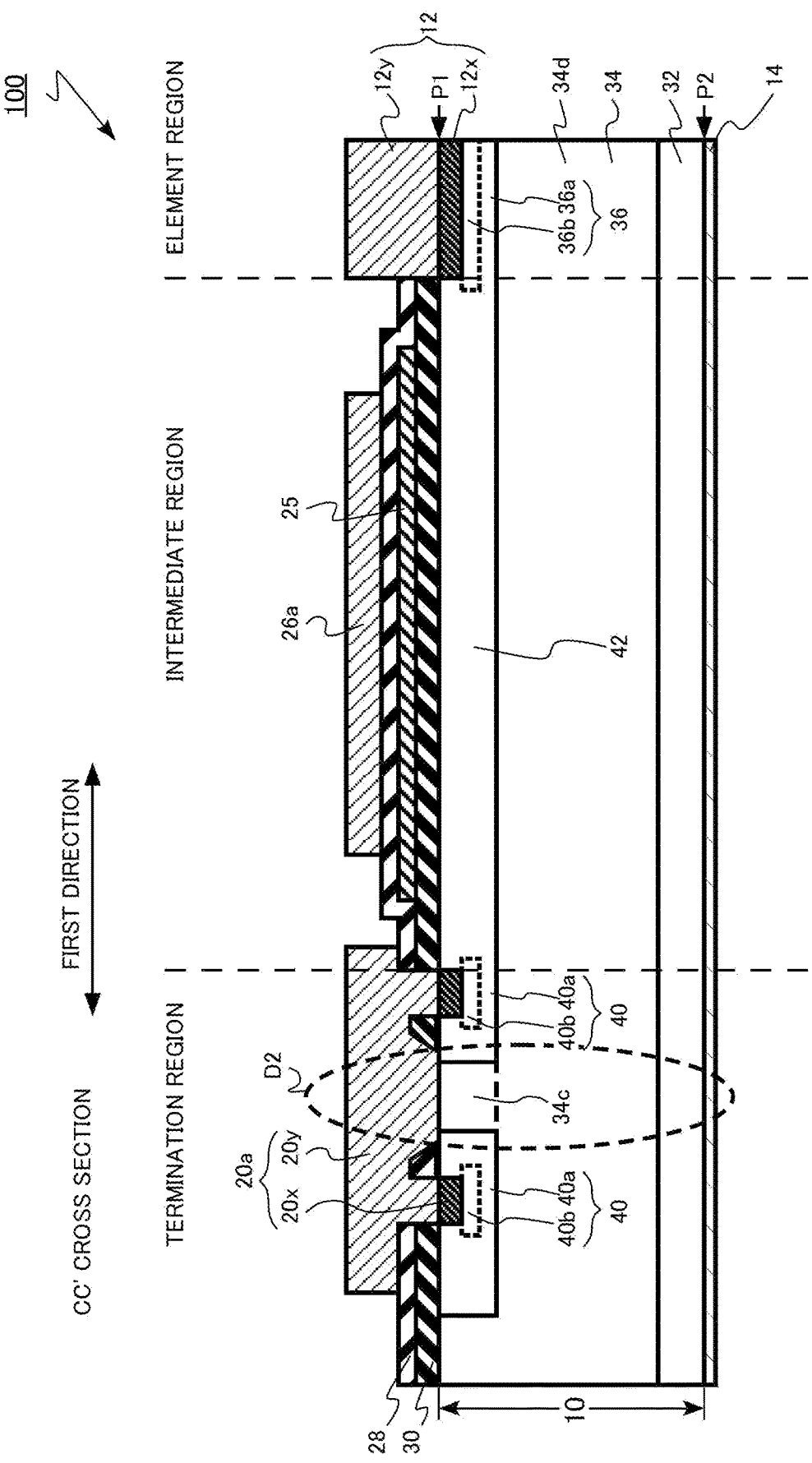
FIG. 6 is a schematic cross-sectional view of the semiconductor device of the first embodiment.

FIG. 6 is a schematic cross-sectional view of the semiconductor device of the first embodiment. FIG. 6 is a cross-sectional view taken along the line CC' of FIGS. 1A, 1B, 2A, and 2B.

Figure 7:
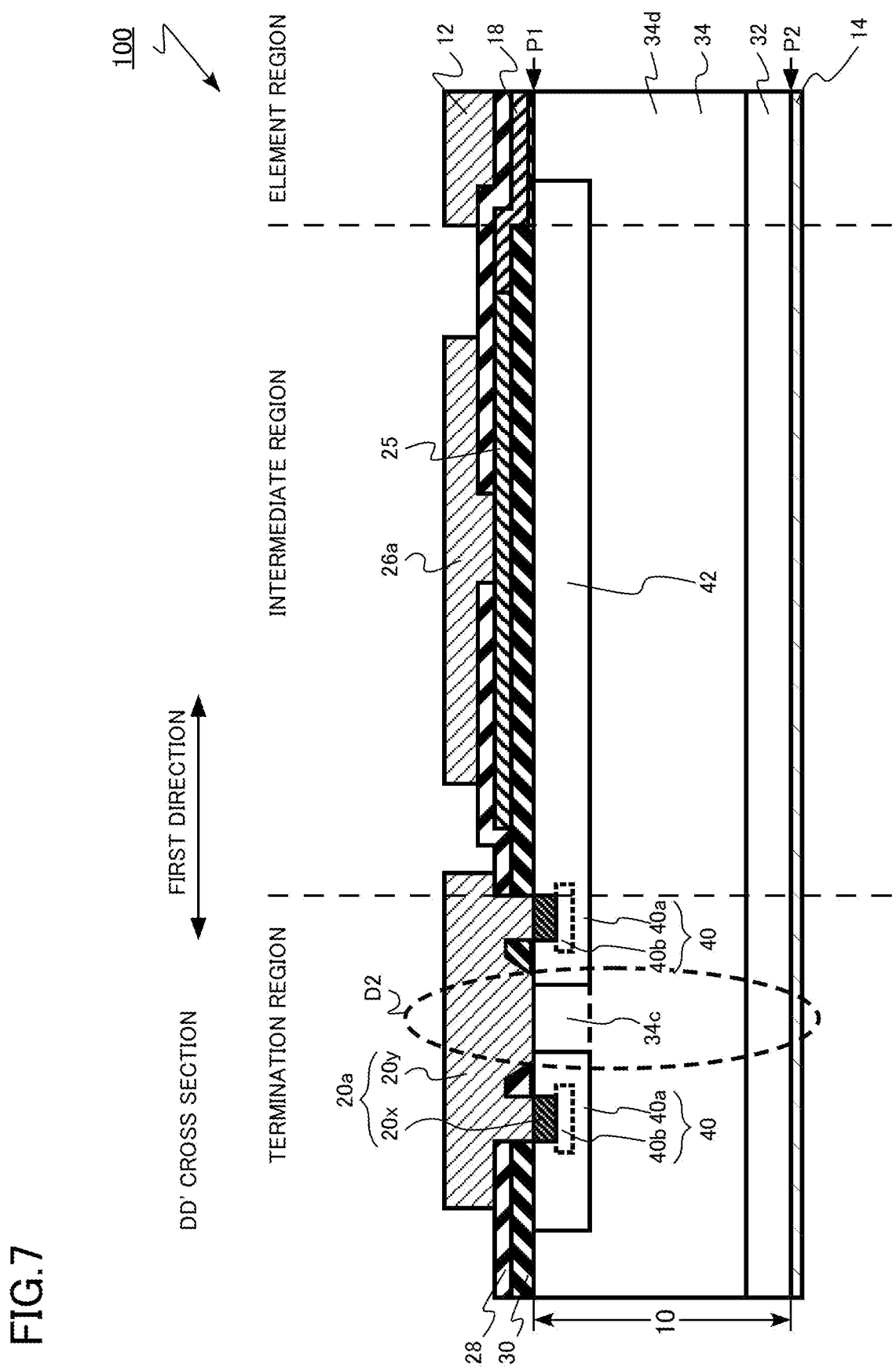
FIG. 7 is a schematic cross-sectional view of the semiconductor device of the first embodiment.

FIG. 7 is a schematic cross-sectional view of the semiconductor device of the first embodiment. FIG. 7 is a cross-sectional view taken along the line DD' of FIGS. 1A, 1B, 2A, and 2B.

Figure 8:
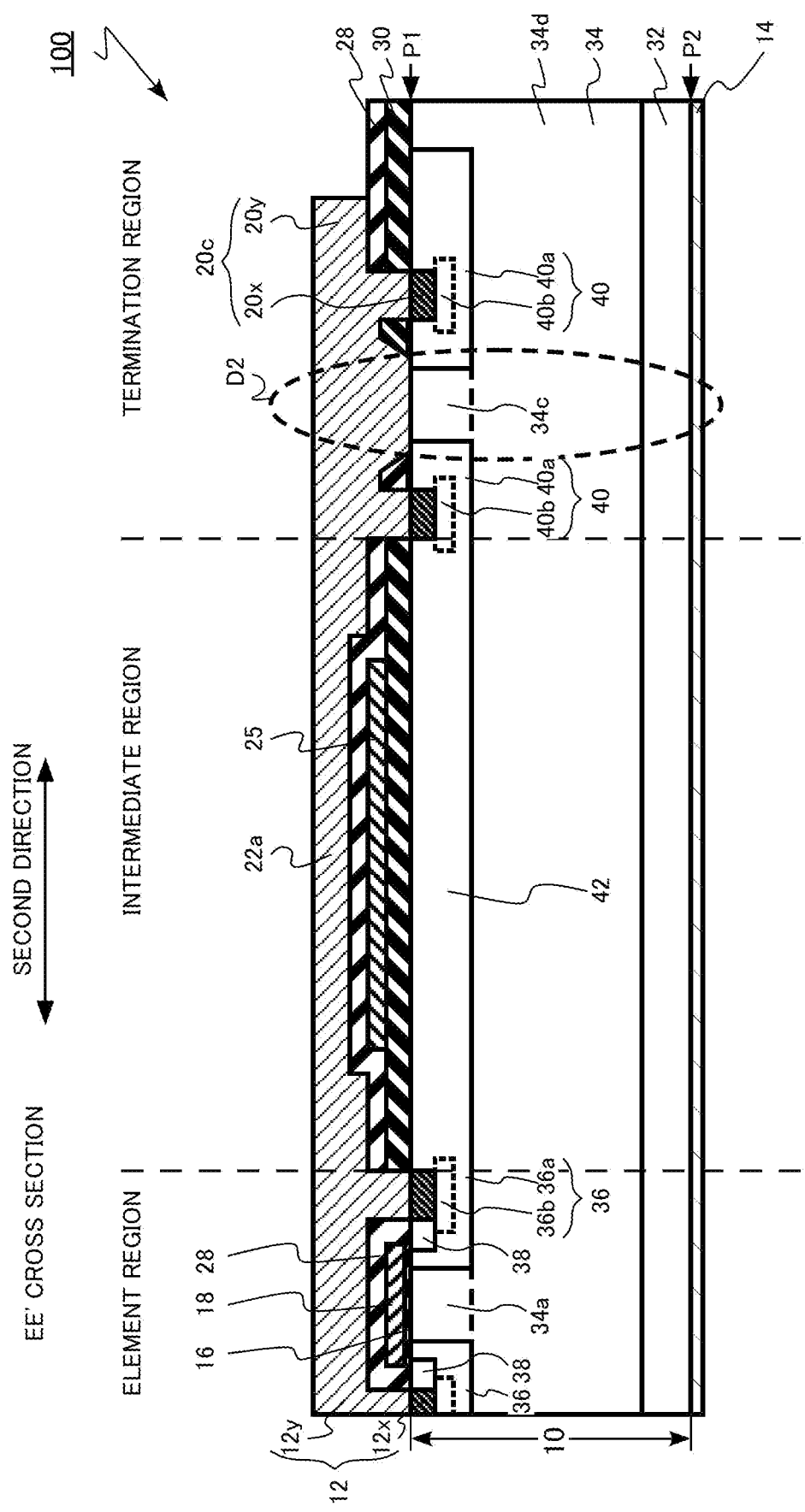
FIG. 8 is a schematic cross-sectional view of the semiconductor device of the first embodiment.

FIG. 8 is a schematic cross-sectional view of the semiconductor device of the first embodiment. FIG. 8 is a cross-sectional view taken along the line EE' of FIGS. 1A, 1B, 2A, and 2B.

The semiconductor device of the first embodiment is a planar gate type vertical MOSFET 100 using silicon carbide. The MOSFET 100 is, for example, a double implantation MOSFET (DIMOSFET) in which a body region and a source region are formed by ion implantation. In addition, the semiconductor device of the first embodiment includes an SBD as a built-in diode.

Hereinafter, a case where the first conductive type is n-type and the second conductive type is p-type will be described as an example. The MOSFET 100 is a vertical n-channel MOSFET having electrons as carriers.

The MOSFET 100 includes an element region 101, a termination region 102, and an intermediate region 103.

The element region 101 includes a plurality of MOSFET regions and a plurality of SBD regions. The MOSFET region includes a transistor Tr. The SBD region includes a first diode D1. The termination region 102 includes a second diode D2.

The MOSFET 100 includes a silicon carbide layer 10, a source electrode 12 (first electrode), a drain electrode 14, a gate insulating layer 16, a gate electrode 18, a first wiring layer 20, a first connection layer 21, a second connection layer 22a, a second connection layer 22b, a gate electrode pad 24, a gate wiring layer 25, a second wiring layer 26, an interlayer insulating layer 28, and a field insulating layer 30. The first wiring layer 20 has a first portion 20a, a second portion 20b, a third portion 20c, and a fourth portion 20d. The second wiring layer 26 has a first line 26a and a second line 26b.

The source electrode 12 is an example of the first electrode. The drain electrode 14 is an example of the second electrode.

In the following description, the second connection layer 22a and the second connection layer 22b may be collectively referred to as a second connection layer 22.

The silicon carbide layer 10 includes an $n^+$-type drain region 32, an $n^-$-type drift region 34 (first silicon carbide region), a p-type body region 36 (second silicon carbide region), an $n^+$-type source region 38 (third silicon carbide region), a p-type resurf region 40 (fourth silicon carbide region), and a p-type connection region 42 (fifth silicon carbide region). The drift region 34 has a JFET region 34a (first region), a first JBS region 34b (second region), a second JBS region 34c (third region), and a lower region 34d. The body region 36 has a low-concentration body region 36a and a high-concentration body region 36b. The resurf region 40 has a low-concentration resurf region 40a and a high-concentration resurf region 40b.

The drift region 34 is an example of the first silicon carbide region. The body region 36 is an example of the second silicon carbide region. The JFET region 34a is an example of the first region. The first JBS region 34b is an example of the second region. The second JBS region 34c is an example of a third region. The source region 38 is an example of the third silicon carbide region. The resurf region 40 is an example of the fourth silicon carbide region. The connection region 42 is an example of the fifth silicon carbide region. In addition, JBS is an abbreviation for Junction Barrier Schottky.

As shown in FIG. 3, the element region 101 includes a plurality of MOSFET regions and a plurality of SBD regions. The MOSFET region includes the transistor Tr. The SBD region includes the first diode D1.

The MOSFET region extends in the first direction. The MOSFET region is repeatedly arranged in the second direction.

The SBD region extends in the first direction. The SBD region is repeatedly arranged in the second direction. Two MOSFET regions are provided between SBD regions adjacent to each other in the second direction. In the MOSFET 100, the ratio between the number of MOSFET regions and the number of SBD regions is 2:1.

The ratio between the number of MOSFET regions and the number of SBD regions is not limited to 2:1. For example, the ratio between the number of MOSFET regions and the number of SBD regions may be 1:1 or 3:1 or any other ratio.

As shown in FIGS. 1A, 2B, and 3, the element region 101 includes the silicon carbide layer 10, the source electrode 12 (first electrode), the drain electrode 14 (second electrode), the gate insulating layer 16, the gate electrode 18, and the interlayer insulating layer 28.

The silicon carbide layer 10 in the element region 101 is provided between the source electrode 12 and the drain electrode 14. The silicon carbide layer 10 is a single crystal SiC. The silicon carbide layer 10 is, for example, 4H—SiC.

The silicon carbide layer 10 includes a first face ("P1" in FIG. 3) and a second face ("P2" in FIG. 3). Hereinafter, the first face P1 may be referred to as a surface, and the second face P2 may be referred to as a back surface. The first face P1 is disposed on the source electrode 12 side of the silicon carbide layer 10. In addition, the second face P2 is disposed on the drain electrode 14 side of the silicon carbide layer 10. The first face P1 and the second face P2 face each other. Hereinafter, the "depth" means a depth in a direction toward the second face with the first face as a reference.

The first face is parallel to the first and second directions. The second direction is perpendicular to the first direction.

The first face P1 is, for example, a face inclined by an angle equal to or more than 0° and equal to or less than 8° with respect to the (0001) face. In addition, the second face P2 is, for example, a face inclined by an angle equal to or more than 0° and equal to or less than 8° with respect to the (000-1) face. The (0001) face is referred to as a silicon face. The (000-1) face is referred to as a carbon face.

The thickness of the silicon carbide layer 10 is equal to or more than 5 μm and equal to or less than 150 μm, for example.

As shown in FIG. 3, the silicon carbide layer 10 in the element region 101 includes the $n^+$-type drain region 32, the $n^-$-type drift region 34 (first silicon carbide region), the p-type body region 36 (second silicon carbide region), and the $n^+$-type source region 38 (third silicon carbide region). The drift region 34 has the JFET region 34a (first region), the first JBS region 34b (second region), and the lower region 34d. The body region 36 has the low-concentration body region 36a and the high-concentration body region 36b.

The $n^+$-type drain region 32 is provided on the back surface side of the silicon carbide layer 10. The drain region 32 contains, for example, nitrogen (N) as an n-type impurity. The n-type impurity concentration in the drain region 32 is equal to or more than $1\times10^{18}$ cm$^{-3}$ and equal to or less than $1\times10^{21}$ cm$^{-3}$, for example.

The $n^-$-type drift region 34 is provided between the drain region 32 and the first face P1. The $n^-$-type drift region 34 is provided between the source electrode 12 and the drain electrode 14. The $n^-$-type drift region 34 is provided between the gate electrode 18 and the drain electrode 14.

The $n^-$-type drift region 34 is provided on the drain region 32. The drift region 34 contains, for example, nitrogen (N) as an n-type impurity. The n-type impurity concentration in the drift region 34 is lower than the n-type impurity concentration in the drain region 32. The n-type impurity concentration in the drift region 34 is equal to or more than $4\times10^{14}$ cm$^{-3}$ and equal to or less than $1\times10^{17}$ cm$^{-3}$, for example. The thickness of the drift region 34 is equal to or more than 5 μm and equal to or less than 150 μm, for example.

The $n^-$-type drift region 34 has the JFET region 34a, the first JBS region 34b, and the lower region 34d.

The JFET region 34a is provided between the lower region 34d and the first face P1. The JFET region 34a is in contact with the first face P1. The JFET region 34a is provided between two adjacent body regions 36.

The JFET region 34a extends in the first direction. The JFET region 34a faces the gate electrode 18 with the gate insulating layer 16 interposed therebetween.

The JFET region 34a functions as a current path for the MOSFET 100. The n-type impurity concentration in the JFET region 34a is higher than, for example, the n-type impurity concentration in the lower region 34d. The n-type impurity concentration in the JFET region 34a is equal to or more than $5\times10^{16}$ cm$^{-3}$ and equal to or less than $2\times10^{17}$ cm$^{-3}$, for example.

The first JBS region 34b is provided between the lower region 34d and the first face P1. The first JBS region 34b is in contact with the first face P1. The first JBS region 34b is provided between two adjacent body regions 36.

The first JBS region 34b extends in the first direction. The first JBS region 34b is in contact with the source electrode 12.

The first diode D1 is an SBD. The n-type impurity concentration in the first JBS region 34b is higher than, for example, the n-type impurity concentration in the lower region 34d. The n-type impurity concentration in the first JBS region 34b is equal to or more than $5\times10^{16}$ cm$^{-3}$ and equal to or less than $2\times10^{17}$ cm$^{-3}$, for example.

The p-type body region 36 is provided between the drift region 34 and a first face P1. The body region 36 extends in the first direction. The body region 36 functions as a channel region of the MOSFET 100. The body region 36 functions as a channel region of the transistor Tr.

The depth of the body region 36 is equal to or more than 0.5 μm and equal to or less than 1.0 μm, for example.

The body region 36 is electrically connected to the source electrode 12. The body region 36 is fixed to the electric potential of the source electrode 12.

A part of the body region 36 is in contact with the first face P1. A part of the body region 36 faces the gate electrode 18. A part of the body region 36 becomes a channel region of the MOSFET 100. The gate insulating layer 16 is interposed between a part of the body region 36 and the gate electrode 18.

The body region 36 is adjacent to the JFET region 34a. The body region 36 is in contact with the JFET region 34a.

The body region 36 has the low-concentration body region 36a and the high-concentration body region 36b. The high-concentration body region 36b is provided between the low-concentration body region 36a and the source electrode 12. The high-concentration body region 36b is in contact with the source electrode 12.

The body region 36 contains, for example, aluminum (Al) as a p-type impurity. The p-type impurity concentration in the low-concentration body region 36a is lower than the p-type impurity concentration in the high-concentration body region 36b. The p-type impurity concentration in the low-concentration body region 36a is equal to or more than $5\times10^{17}$ cm$^{-3}$ and equal to or less than $5\times10^{19}$ cm$^{-3}$, for example. The p-type impurity concentration in the high-concentration body region 36b is equal to or more than $1\times10^{19}$ cm$^{-3}$ and equal to or less than $1\times10^{21}$ cm$^{-3}$, for example.

The body region 36 is electrically connected to the source electrode 12. The contact between the body region 36 and the source electrode 12 is, for example, an ohmic contact. The body region 36 is fixed to the electric potential of the source electrode 12.

The $n^+$-type source region 38 is provided between the body region 36 and the first face P1. The source region 38 extends in the first direction.

The source region 38 contains, for example, phosphorus (P) or nitrogen (N) as an n-type impurity. The n-type impurity concentration in the source region 38 is higher than the n-type impurity concentration in the drift region 34.

The n-type impurity concentration in the source region 38 is equal to or more than $1 \times 10^{19}$ cm$^{-3}$ and equal to or less than $1 \times 10^{21}$ cm$^{-3}$, for example. The depth of the source region 38 is smaller than the depth of the body region 36. The depth of the source region 38 is equal to or more than 0.05 μm and equal to or less than 0.2 μm, for example.

The source region 38 is in contact with the source electrode 12. The source region 38 is electrically connected to the source electrode 12. The contact between the source region 38 and the source electrode 12 is, for example, an ohmic contact. The source region 38 is fixed to the electric potential of the source electrode 12.

The gate electrode 18 is provided on the first face P1 side of the silicon carbide layer 10. The gate electrode 18 extends in the first direction, for example. A plurality of gate electrodes 18 are arranged in parallel with each other in the second direction. The gate electrode 18 has a striped shape.

The gate electrode 18 is a conductive layer. The gate electrode 18 is, for example, polycrystalline silicon containing p-type impurities or n-type impurities.

The gate electrode 18 faces the body region 36. The gate electrode 18 faces the JFET region 34a.

The gate insulating layer 16 is provided between the gate electrode 18 and the body region 36. The gate insulating layer 16 is provided between the gate electrode 18 and the JFET region 34a. The gate insulating layer 16 is provided between the gate electrode 18 and the source region 38.

The gate insulating layer 16 is, for example, silicon oxide. For example, a high-k insulating material (insulating material with a high dielectric constant) can be applied to the gate insulating layer 16.

The interlayer insulating layer 28 is provided on the gate electrode 18 and the silicon carbide layer 10. The interlayer insulating layer 28 is, for example, silicon oxide.

The source electrode 12 is in contact with the silicon carbide layer 10. The source electrode 12 is in contact with the source region 38. The source electrode 12 is in contact with the body region 36. The source electrode 12 is in contact with the high-concentration body region 36b. The source electrode 12 is in contact with the first JBS region 34b.

The source electrode 12 has, for example, a suicide layer 12x and a metal layer 12y. The silicide layer 12x is provided between the silicon carbide layer 10 and the metal layer 12y. The silicide layer 12x extends in the first direction.

The silicide layer 12x is in contact with the source region 38. The suicide layer 12x is in contact with the body region 36. The silicide layer 12x is in contact with the high-concentration body region 36b.

The source electrode 12 functions as an anode of the first diode D1.

The silicide layer 12x of the source electrode 12 contains silicide. The silicide layer 12x is, for example, nickel silicide or titanium silicide.

The contact between the source electrode 12 and the source region 38 becomes an ohmic contact by providing the silicide layer 12x. The contact between the source electrode 12 and the body region 36 becomes an ohmic contact by providing the silicide layer 12x. The contact between the source electrode 12 and the high-concentration body region 36b becomes an ohmic contact by providing the suicide layer 12x.

The metal layer 12y of the source electrode 12 contains metal. The metal layer 12y has, for example, a stacked structure of titanium (Ti) and aluminum (Al).

The metal layer 12y is in contact with the first JBS region 34b. The contact between the source electrode 12 and the first JBS region 34b is a Schottky contact. The contact between the metal layer 12y and the first JBS region 34b is a Schottky contact.

The drain electrode 14 is provided on the back surface of the silicon carbide layer 10. The drain electrode 14 is in contact with the drain region 32.

The drain electrode 14 is, for example, a metal or a metal semiconductor compound. The drain electrode 14 contains at least one material selected from a group consisting of nickel silicide, titanium (Ti), nickel (Ni), silver (Ag), and gold (Au), for example.

As shown in FIG. 3, the transistor Tr includes the gate electrode 18, the gate insulating layer 16, the JFET region 34a, the body region 36, the source region 38, the source electrode 12, and the drain electrode 14. When the MOSFET 100 is in the ON state, a current flows from the drain electrode 14 to the source electrode 12 due to the transistor Tr.

As shown in FIG. 3, the first diode D1 includes the source electrode 12, the first JBS region 34b, and the drain electrode 14. When a forward bias is applied to the first diode D1, a current flows from the source electrode 12 to the drain electrode 14.

The termination region 102 surrounds the element region 101, as shown in FIG. 1A. The termination region 102 includes the second diode D2. The termination region 102 reduces the strength of the electric field applied to the termination portion of the pn junction in the element region 101 when the MOSFET 100 is in the off state. The termination region 102 has a function of increasing the dielectric breakdown voltage of the MOSFET 100.

As shown in FIGS. 1B, 5, 6, 7, and 8, the termination region 102 includes the silicon carbide layer 10, the first wiring layer 20, the drain electrode 14 (second electrode), the interlayer insulating layer 28, and the field insulating layer 30.

The silicon carbide layer 10 in the termination region 102 is provided between the first wiring layer 20 and the drain electrode 14.

As shown in FIGS. 5 to 8, the silicon carbide layer 10 in the termination region 102 includes the n$^+$-type drain region 32, the n$^-$-type drift region 34 (first silicon carbide region), and the p-type resurf region 40 (fourth silicon carbide region). The drift region 34 has the second JBS region 34c (third region) and the lower region 34d. The resurf region 40 has the low-concentration resurf region 40a and the high-concentration resurf region 40b.

The n$^+$-type drain region 32 is provided on the back surface side of the silicon carbide layer 10. The drain region 32 contains, for example, nitrogen (N) as an n-type impurity.

The n$^-$-type drift region 34 is provided between the drain region 32 and the first face P1. The n$^-$-type drift region 34 is provided between the first wiring layer 20 and the drain electrode 14.

The n$^-$-type drift region 34 is provided on the drain region 32. The drift region 34 contains, for example, nitrogen (N) as an n-type impurity.

The n$^-$-type drift region 34 has the second JBS region 34c and the lower region 34d.

The second JBS region 34c is provided between the lower region 34d and the first face P1. The second JBS region 34c is in contact with the first face P1. The second JBS region 34c is provided between the two resurf regions 40 adjacent to each other. The second JBS region 34c is in contact with the first wiring layer 20.

The second diode D2 is an SBD. The n-type impurity concentration in the second JBS region 34c is higher than, for example, the n-type impurity concentration in the lower region 34d. The n-type impurity concentration in the second JBS region 34c is equal to or more than $5\times10^{16}$ cm$^{-3}$ and equal to or less than $2\times10^{17}$ cm$^{-3}$, for example.

The p-type resurf region 40 is provided between the drift region 34 and the first face P1. The depth of the resurf region 40 is equal to or more than 0.5 μm and equal to or less than 1.0 μm, for example.

The resurf region 40 is electrically connected to the first wiring layer 20. The contact between the resurf region 40 and the first wiring layer 20 is, for example, an ohmic contact. The resurf region 40 is fixed to the electric potential of the first wiring layer 20.

The resurf region 40 has the low-concentration resurf region 40a and the high-concentration resurf region 40b. The high-concentration resurf region 40b is provided between the low-concentration resurf region 40a and the first wiring layer 20. The high-concentration resurf region 40b is in contact with the first wiring layer 20.

The resurf region 40 contains, for example, aluminum (Al) as a p-type impurity. The p-type impurity concentration in the low-concentration resurf region 40a is lower than the p-type impurity concentration in the high-concentration resurf region 40b. The p-type impurity concentration in the low-concentration resurf region 40a is equal to or more than $5\times10^{17}$ cm$^{-3}$ and equal to or less than $5\times10^{19}$ cm$^{-3}$, for example. The p-type impurity concentration in the high-concentration resurf region 40b is equal to or more than $1\times10^{19}$ cm$^{-3}$ and equal to or less than $1\times10^{21}$ cm$^{-3}$, for example.

The interlayer insulating layer 28 is provided on the field insulating layer 30. The interlayer insulating layer 23 is, for example, silicon oxide.

The field insulating layer 30 is provided on the silicon carbide layer 10. The field insulating layer 30 is, for example, silicon oxide.

As shown in FIG. 1B, the first wiring layer 20 surrounds the source electrode 12. The first wiring layer 20 is electrically connected to the source electrode 12.

The first wiring layer 20 has the first portion 20a, the second portion 20b, the third portion 20c, and the fourth portion 20d. The first portion 20a extends in the second direction. The second portion 20b extends in the second direction. The source electrode 12 is interposed between the first portion 20a and the second portion 20b. The third portion 20c extends in the first direction. The fourth portion 20d extends in the first direction. The source electrode 12 is interposed between the third portion 20c and the fourth portion 20d.

The first wiring layer 20 is in contact with the silicon carbide layer 10. The first wiring layer 20 is in contact with the resurf region 40. The first wiring layer 20 is in contact with the high-concentration resurf region 40b.

The first wiring layer 20 has, for example, a silicide layer 20x and a metal layer 20y. The silicide layer 20x is provided between the silicon carbide layer 10 and the metal layer 20y.

The silicide layer 20x is in contact with the resurf region 40. The silicide layer 20x is in contact with the high-concentration resurf region 40b.

The first wiring layer 20 functions as an anode of the second diode D2.

The silicide layer 20x of the first wiring layer 20 contains suicide. The suicide layer 20x is, for example, nickel silicide or titanium silicide.

The contact between the first wiring layer 20 and the resurf region 40 becomes an ohmic contact by providing the silicide layer 20x. The contact between the first wiring layer 20 and the high-concentration resurf region 40b becomes an ohmic contact by providing the silicide layer 20x.

The metal layer 20y of the first wiring layer 20 contains metal. The metal layer 20y has, for example, a stacked structure of titanium (Ti) and aluminum (Al).

The metal layer 12y is in contact with the second JBS region 34c. The contact between the first wiring layer 20 and the first JBS region 34b is a Schottky contact. The contact between the metal layer 20y and the second JBS region 34c is a Schottky contact.

The drain electrode 14 is provided on the back surface of the silicon carbide layer 10. The drain electrode 14 is in contact with the drain region 32.

As shown in FIGS. 5 to 8, the second diode D2 includes the first wiring layer 20, the second JBS region 34c, and the drain electrode 14. When a forward bias is applied to the second diode D2, a current flows from the first wiring layer 20 to the drain electrode 14.

As shown in FIG. 1A, the intermediate region 103 is provided between the element region 101 and the termination region 102. The intermediate region 103 surrounds the element region 101. The termination region 102 surrounds the intermediate region 103.

The intermediate region 103 does not include the transistor Tr, the first diode D1, and the second diode D2.

As shown in FIGS. 1B, 2B, and 5 to 8, the intermediate region 103 includes the silicon carbide layer 10, the first connection layer 21, the second connection layer 22a, the second connection layer 22b, and the gate electrode pad 24, the gate wiring layer 25, the second wiring layer 26, the drain electrode 14 (second electrode), the interlayer insulating layer 28, and the field insulating layer 30.

The silicon carbide layer 10 in the intermediate region 103 is provided between the first connection layer 21 and the drain electrode 14, between the second connection layer 22 and the drain electrode 14, between the second wiring layer 26 and the drain electrode 14, and between the gate electrode pad 24 and the drain electrode 14.

As shown in FIGS. 5 to 8, the silicon carbide layer 10 in the intermediate region 103 includes the n$^+$-type drain region 32, the n$^-$-type drift region 34 (first silicon carbide region), and the p-type connection region 42 (fifth silicon carbide region).

The n$^+$-type drain region 32 is provided on the back surface side of the silicon carbide layer 10. The drain region 32 contains, for example, nitrogen (N) as an n-type impurity.

The n$^-$-type drift region 34 is provided between the drain region 32 and the first face P1. The n$^-$-type drift region 34 is provided between the first connection layer 21 and the drain electrode 14.

The n$^-$-type drift region 34 is provided on the drain region 32. The drift region 34 contains, for example, nitrogen (N) as an n-type impurity.

The n$^-$-type drift region 34 has the lower region 34d.

The p-type connection region 42 is provided between the drift region 34 and the first face P1. The depth of the connection region 42 is equal to or more than 0.5 μm and equal to or less than 1.0 μm, for example.

The connection region 42 is provided between the body region 36 and the resurf region 40. The connection region 42 is in contact with, for example, the body region 36. The connection region 42 is in contact with, for example, the resurf region 40. The connection region 42, the body region 36, and the resurf region 40 are, for example, continuous. The connection region 42, the body region 36, and the resurf region 40 are simultaneously formed by using, for example, the same manufacturing process.

The connection region 42 is electrically connected to the source electrode 12 through the body region 36, for example. The connection region 42 is electrically connected to the first wiring layer 20 through the resurf region 40, for example.

The connection region 42 is fixed to, for example, the electric potential of the source electrode 12. The connection region 42 is fixed to, for example, the electric potential of the first wiring layer 20.

The connection region 42 contains, for example, aluminum (Al) as a p-type impurity. The p-type impurity concentration in the connection region 42 is equal to or more than $5 \times 10^{17}$ cm$^{-3}$ and equal to or less than $5 \times 10^{19}$ cm$^{-3}$, for example.

The gate wiring layer 25 is provided between the second wiring layer 26 and the silicon carbide layer 10. The gate wiring layer 25 is electrically connected to the gate electrode pad 24. The gate wiring layer 25 is electrically connected to the gate electrode 18. The gate wiring layer 25 is electrically connected to the first wiring layer 20.

The gate wiring layer 25 includes a first gate line 25a extending in the second direction and a second gate line 25b extending in the second direction. The gate electrode 13 is interposed between the first gate line 25a and the second gate line 25b.

The gate wiring layer 25 is a conductive layer. The gate wiring layer 25 is, for example, polycrystalline silicon containing p-type impurities or n-type impurities.

The interlayer insulating layer 28 is provided on the field insulating layer 30. The interlayer insulating layer 28 is, for example, silicon oxide.

The field insulating layer 30 is provided on the silicon carbide layer 10. The field insulating layer 30 is, for example, silicon oxide.

The first connection layer 21 is provided on the first face P1 side of the silicon carbide layer 10. The first connection layer 21 is provided between the source electrode 12 and the first wiring layer 20. The first connection layer 21 is provided between the source electrode 12 and the fourth portion 20d of the first wiring layer 20.

The first connection layer 21 is in contact with the source electrode 12. The first connection layer 21 is in contact with the fourth portion 20d of the first wiring layer 20. The first connection layer 21 is electrically connected to the source electrode 12 and the fourth portion 20d of the first wiring layer 20.

The first connection layer 21 contains metal. The first connection layer 21 has, for example, a stacked structure of titanium (Ti) and aluminum (Al).

The second connection layer 22 is provided on the first face P1 side of the silicon carbide layer 10. The second connection layer 22 is provided between the source electrode 12 and the first wiring layer 20. The second connection layer 22 is provided between the source electrode 12 and the third portion 20c of the first wiring layer 20. The source electrode 12 is interposed between the second connection layer 22 and the first connection layer 21.

The second connection layer 22 is provided between the gate electrode pad 24 and the second wiring layer 26 in the second direction, for example. The gate electrode pad 24 and the second wiring layer 26 are electrically connected to each other through the gate wiring layer 25 between the second connection layer 22 and the silicon carbide layer 10, for example. The gate electrode pad 24 and the second wiring layer 26 are electrically connected to each other through the gate wiring layer 25 below the second connection layer 22, for example.

The second connection layer 22 is in contact with the source electrode 12. The second connection layer 22 is in contact with the third portion 20c of the first wiring layer 20. The second connection layer 22 electrically connects the source electrode 12 and the third portion 20c of the first wring layer 20 to each other.

For example, the second connection layer 22a is provided between the source electrode 12 and the third portion 20c of the first wiring layer 20. For example, the second connection layer 22b is provided between the source electrode 12 and the third portion 20c of the first wiring layer 20.

The second connection layer 22 contains metal. The second connection layer 22 has, for example, a stacked structure of titanium (Ti) and aluminum (Al).

The gate electrode pad 24 is provided on the first face P1 side of the silicon carbide layer 10. The gate electrode pad 24 contains metal. The gate electrode pad 24 has, for example, a stacked structure of titanium (Ti) and aluminum (Al).

The second wiring layer 26 is provided on the first face P1 side of the silicon carbide layer 10. The second wiring layer 26 is electrically connected to the gate electrode pad 24.

The second wiring layer 26 has the first line 26a and the second line 26b. A part of the first line 26a extends in the second direction. A part of the second line 26b extends in the second direction.

The first line 26a is provided between the first portion 20a of the first wiring layer 20 and the source electrode 12. The second line 26b is provided between the second portion 20b of the first wiring layer 20 and the source electrode 12.

The second wiring layer 26 contains metal. The second wiring layer 26 has, for example, a stacked structure of titanium (Ti) and aluminum (Al).

For example, the source electrode 12, the first wiring layer 20, the first connection layer 21, the second connection layer 22, the gate electrode pad 24, and the second wiring layer 26 contain the same material. For example, the source electrode 12, the first wiring layer 20, the first connection layer 21, the second connection layer 22, the gate electrode pad 24, and the second wiring layer 26 contain titanium and aluminum. For example, the source electrode 12, the first wiring layer 20, the first connection layer 21, the second connection layer 22, the gate electrode pad 24, and the second wiring layer 26 are simultaneously formed by using the same manufacturing process.

The gate electrode 18 provided in the element region 101 is electrically connected to the gate electrode pad 24 through the gate wiring layer 25 and the second wiring layer 26.

The second wiring layer 26 contains metal. The second wiring layer 26 has, for example, a stacked structure of titanium (Ti) and aluminum (Al).

The drain electrode 14 is provided on the back surface of the silicon carbide layer 10. The drain electrode 14 is in contact with the drain region 32.

Next, the function and effect of the MOSFET 100 of the first embodiment will be described.

Figure 9:
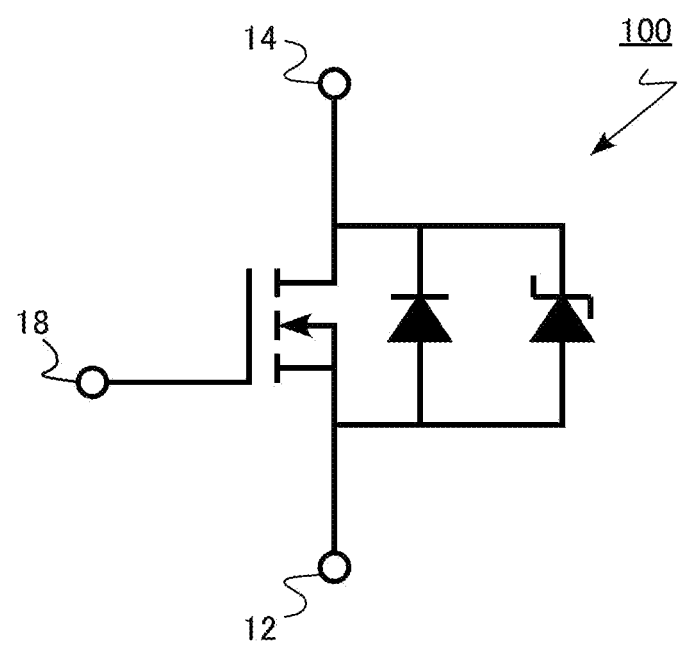
FIG. 9 is an equivalent circuit diagram of the semiconductor device of the first embodiment.

FIG. 9 is an equivalent circuit diagram of the semiconductor device of the first embodiment. In the MOSFET 100, between the source electrode 12 and the drain electrode 14 in the element region 101, a pn junction diode and an SBD are connected as built-in diodes in parallel with a transistor.

The body region 36 is on the anode side of the pn junction diode, and the drift region 34 is on the cathode side of the pn junction diode. In addition, the source electrode 12 is the anode of the SBD, and the drain electrode 14 is the cathode of the SBD.

For example, a case where the MOSFET 100 is used as a switching element connected to an inductive load is considered. When the MOSFET 100 is turned off, a voltage that is positive with respect to the drain electrode 14 may be applied to the source electrode 12 due to an induced current caused by an inductive load. In this case, a forward current flows through the built-in diode. This state is also referred to as a reverse conduction state.

If the MOSFET does not include an SBD, a forward current flows through the pn junction diode. The pn junction diode operates in a bipolar manner. When a reflux current is made to flow by using a pn junction diode that operates in a bipolar manner, a stacking fault grows in a silicon carbide layer due to the recombination energy of the carriers. When the stacking fault grows in the silicon carbide layer, there arises a problem that the on-resistance of the MOSFET increases. Increasing the on-resistance of the MOSFET leads to a reduction in the reliability of the MOSFET.

The MOSFET 100 includes an SBD. A forward voltage (Vf) at which a forward current starts to flow through the SBD is lower than a forward voltage (Vf) of the pn junction diode. Therefore, a forward current flows through the SBD prior to the pn junction diode.

The forward voltage (Vf) of the SBD is equal to or more than 1.0 V and less than 2.0 V, for example. The forward voltage (Vf) of the pn junction diode is equal to or more than 2.0 V and equal to or less than 3.0 V, for example.

The SBD operates in a unipolar manner. Therefore, even if a forward current flows, no stacking fault grows in the silicon carbide layer 10 due to the recombination energy of the carriers. Therefore, the increase in the on-resistance of the MOSFET 100 is suppressed. As a result, the reliability of the MOSFET 100 is improved.

In addition, since the forward current flows through the SBD, the voltage on the N side of the pn junction diode rises, and the voltage applied to the pn junction in the vicinity of the SBD effectively drops. Therefore, by providing the SBD, the forward voltage (Vf) of the pn junction diode in the vicinity of the SBD can be effectively increased. Therefore, the flow of forward current through the pn junction diode is suppressed. In other words, the operation start voltage of the pn junction diode can be increased. As a result, the reliability of the MOSFET 100 is improved.

Here, a high surge voltage that momentarily makes the source electrode 12 positive may be applied between the source electrode and the drain electrode of the MOSFET. When a high surge voltage is applied, a large surge current flows through the MOSFET, and the MOSFET may be destroyed.

The maximum allowable peak current value of the surge current allowed in the MOSFET is referred to as a surge current withstand capacity. In a MOSFET in which the SBD is provided, it is desired to improve the surge current withstand capacity from the viewpoint of improving reliability.

Figure 10B:
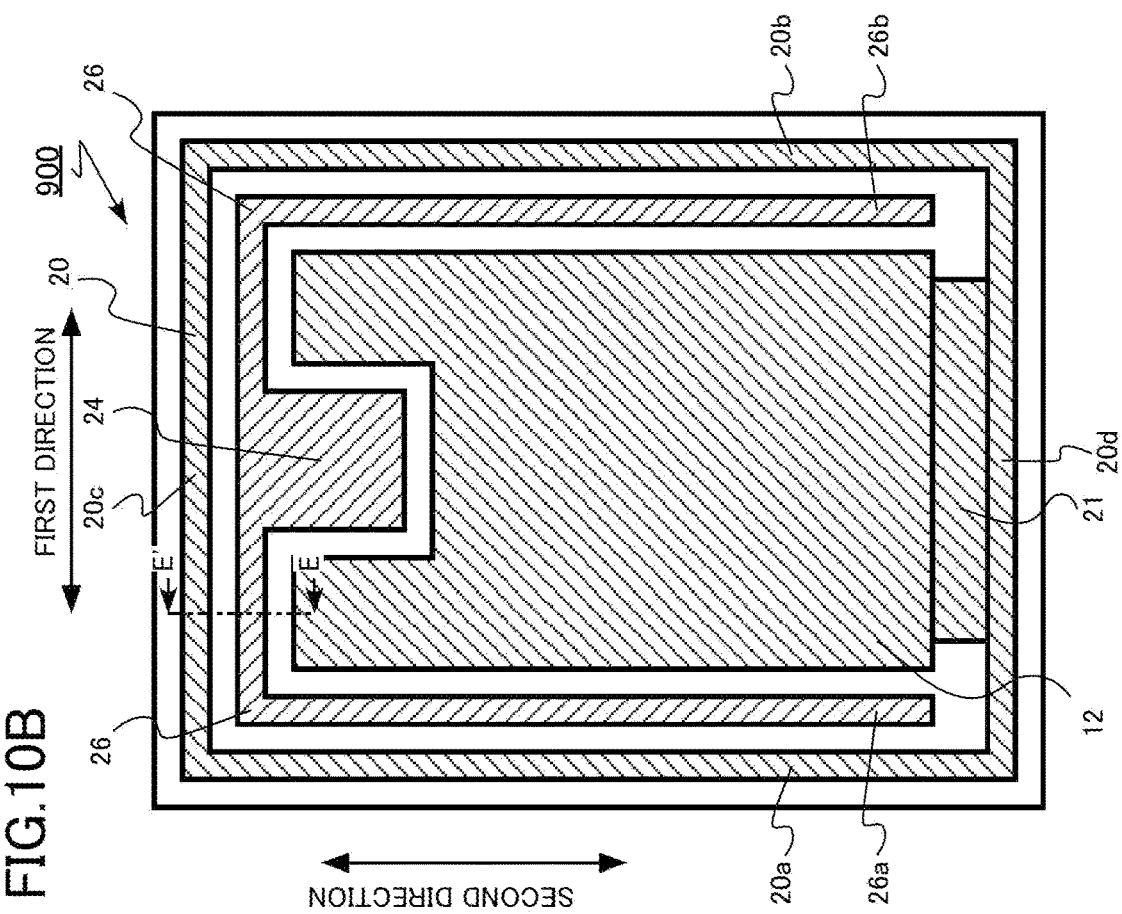
FIGS. 10A and 10B are schematic top views of a semiconductor device of a comparative example.
Figure 10A:
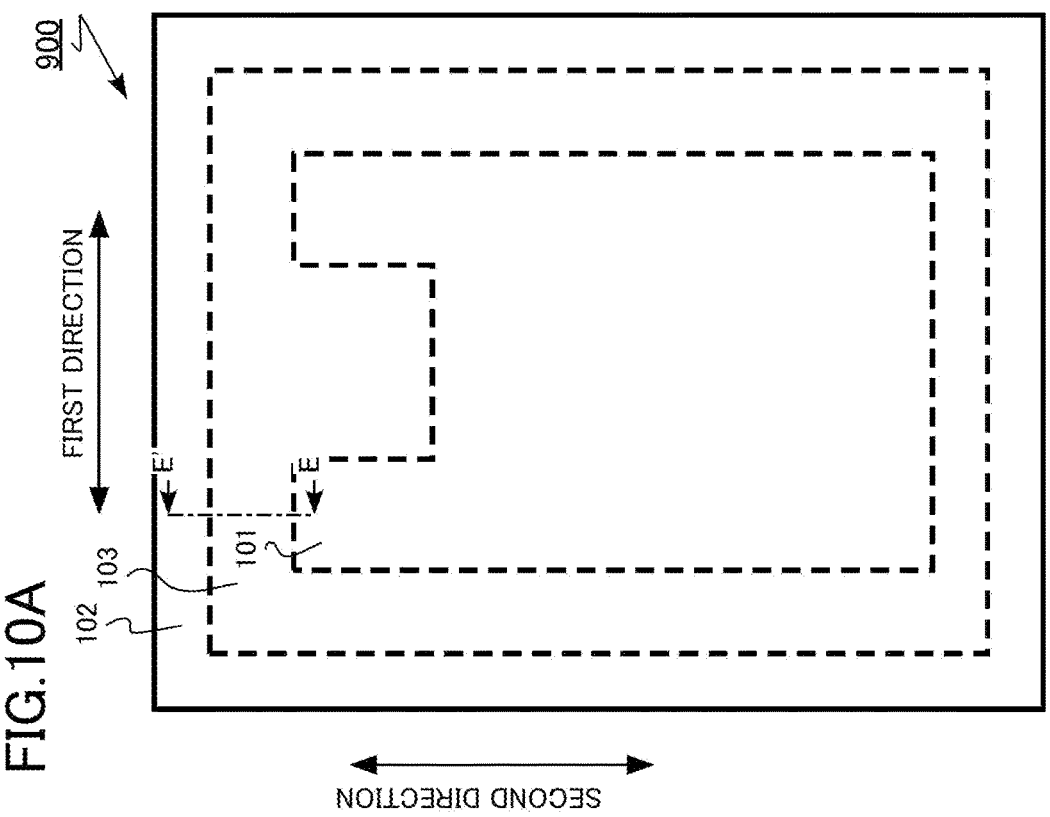

FIGS. 10A and 10B are schematic top views of a semiconductor device of a comparative example. FIGS. 10A and 10B are schematic cross-sectional views of the semiconductor device of the comparative example. The semiconductor device of the comparative example is a MOSFET 900. FIGS. 10A and 10B are diagrams corresponding to FIGS. 1A and 1B of the first embodiment.

The MOSFET 900 of the comparative example is different from the MOSFET 100 of the first embodiment in that the second connection layer 22 is not provided in the intermediate region 103.

Figure 11:
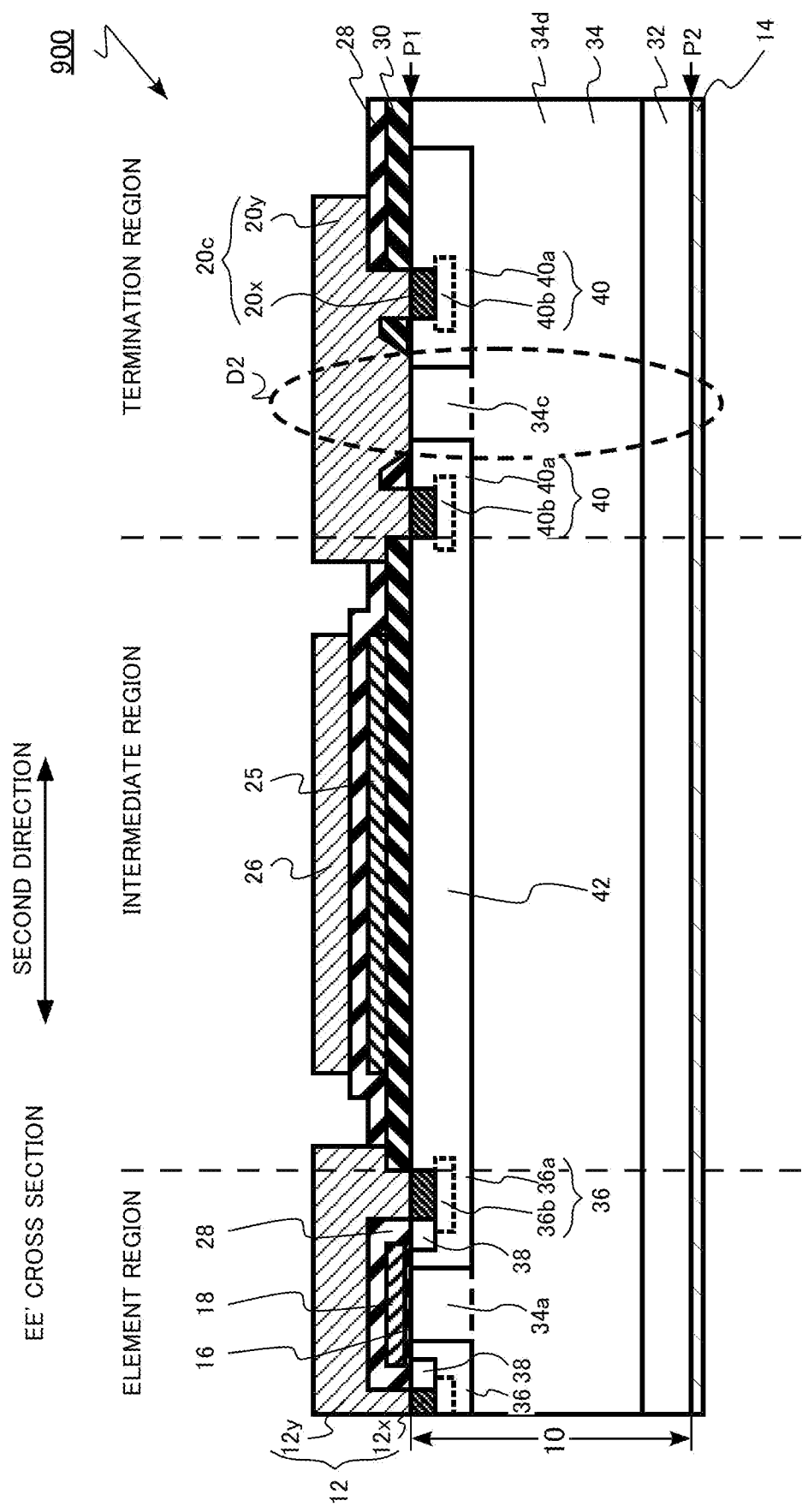
FIG. 11 is a schematic cross-sectional view of a semiconductor device of a comparative example.

FIG. 11 is a schematic cross-sectional view of a semiconductor device of a comparative example. FIG. 11 is a cross-sectional view taken along the line EE' of FIGS. 10A and 10B. FIG. 11 is a diagram corresponding to FIG. 8 of the first embodiment.

As shown in FIG. 11, in the MOSFET 900, unlike in the MOSFET 100, the second connection layer 22 for electrically connecting the source electrode 12 and the third portion 20c of the first wiring layer 20 to each other is not provided. The second wiring layer 26 is provided between the source electrode 12 and the third portion 20c.

FIGS. 12A and 12B are explanatory diagrams of the function and effect of the semiconductor device of the first embodiment. FIG. 12A is a top view of the semiconductor device of the comparative example. FIG. 12B is a top view of the semiconductor device of the first embodiment. FIG. 12A is a diagram corresponding to FIG. 10B. FIG. 12B is a diagram corresponding to FIG. 10B.

In FIGS. 12A and 12B, the path of a surge current when the surge voltage is applied to the source electrode 12 of the MOSFET is indicated by arrows. In FIG. 12A, breakdown points due to the surge current are indicated by asterisks.

When a surge voltage that makes the source electrode 12 positive is applied to the MOSFET 900 and the surge voltage applied to the source electrode 12 exceeds the forward voltage (Vf) of the first diode D1 in the element region 101, a forward current flows through the first diode D1.

In addition, when a surge voltage that makes the source electrode 12 positive is applied to the MOSFET 900, the surge voltage is also applied to the first wiring layer 20 electrically connected to the source electrode 12. When the surge voltage applied to the first wiring layer 20 exceeds the forward voltage (Vf) of the second diode D2 in the termination region 102, a forward current flows through the second diode D2.

When the forward current flows through the second diode D2, as shown by the black arrow in FIG. 12A, a current flows from the source electrode 12 to the first connection layer 21, the fourth portion 20d of the first wiring layer 20, the first portion 20a of the first wiring layer 20, and the third portion 20c of the first wiring layer 20.

For example, an electric potential at a position Y of the third portion 20c is lower than an electric potential at a position X of the source electrode 12 due to voltage drop based on the electrical resistance of the first wiring layer 20. Therefore, for example, a forward current flowing through the second diode D2 below the position Y of the third portion 20c is smaller than a forward current flowing through the first diode D1 below the position X of the source electrode 12.

Since the forward current flows through the second diode D2, a voltage on the N side of the pn junction diode in the vicinity of the second diode D2 rises, and the voltage applied to the pn junction effectively drops. However, if the forward current flowing through the second diode D2 is small, the drop in the voltage applied to the pn junction is suppressed.

Therefore, a forward current easily flows through the pn junction diode in the vicinity of the second diode D2. In other words, the operation start voltage of the pn junction diode in the vicinity of the second diode D2 becomes low.

Therefore, for example, the operation of the pn junction diode in the vicinity of the second diode D2 below the position Y starts earlier than the pn junction diode in the vicinity of the first diode D1 below the position X. In other words, the pn junction diode below the position Y starts its bipolar operation early, and a large forward current flows through the pn junction diode below the position Y.

Since a large forward current flows through the pn junction diode below the position Y, a large current flows through the first wiring layer 20. When a large current flows through the first wiring layer 20, the current density of a corner portion (asterisk in FIG. 12A) where the first connection layer 21 and the fourth portion 20d are in contact with each other increases. As a result, the amount of heat generated at the corner portion (asterisk in FIG. 12A) where the first connection layer 21 and the fourth portion 20d are in contact with each other increases to fuse the first wiring layer 20. Therefore, the surge current withstand capacity of the MOSFET 900 is reduced.

In the MOSFET 100 of the first embodiment, the second connection layer 22 for electrically connecting the source electrode 12 and the third portion 20c of the first wiring layer 20 to each other is provided. By providing the second connection layer 22, the electrical resistance between the position Y of the third portion 20c and the position X of the source electrode 12 becomes smaller than that in the MOSFET 900 of the comparative example. Therefore, the electric potential difference between the position Y of the third portion 20c and the position X of the source electrode 12 is reduced. As a result, the voltage drop of the third portion 20c of the first wiring layer 20 with respect to the source electrode 12 is reduced.

For this reason, when a surge voltage that makes the source electrode 12 positive is applied to the MOSFET 100, the current flowing through the first wiring layer 20 is suppressed. Therefore, the fusing of the first wiring layer 20 is suppressed. As a result, the surge current withstand capacity of the MOSFET 100 is improved.

In addition, when a surge voltage that makes the source electrode 12 positive is applied to the MOSFET 100, a voltage drop occurs at the position Z of the first portion 20a of the first wiring layer 20. However, the voltage drop at the position Z of the MOSFET 100 is smaller than the voltage drop at the position Y of the MOSFET 900 because the wiring length is shorter. Therefore, as compared with the MOSFET 900, the start of the operation of the pn junction diode in the termination region 102 is suppressed. As a result, the surge current withstand capacity of the MOSFET 100 is improved.

It is preferable that the source electrode 12, the first wiring layer 20, the first connection layer 21, the gate electrode pad 24, and the second wiring layer 26 contain the same material. The first wiring layer 20, the first connection layer 21, the gate electrode pad 24, and the second wiring layer 26 can be simultaneously formed by using the same manufacturing process. Therefore, the manufacturing cost of the MOSFET 100 can be reduced.

As described above, according to the first embodiment, a MOSFET in which the fusing of the wiring layer is suppressed and the surge current withstand capacity is improved is realized.

Second Embodiment

A semiconductor device of a second embodiment is different from the semiconductor device of the first embodiment in that the intermediate region further includes a third connection layer for electrically connecting the first electrode and the first portion to each other. Hereinafter, the description of a part of the content overlapping the first embodiment may be omitted.

FIGS. 13A and 13B are schematic top views of the semiconductor device of the second embodiment. FIG. 13A shows a layout pattern of an element region, a termination region, and an intermediate region. FIG. 13B shows a layout pattern of a first electrode, a first wiring layer, a first connection layer, a second connection layer, a third connection layer, a gate pad electrode, and a second wiring layer. FIGS. 13A and 13B are diagrams corresponding to FIGS. 1A and 1B of the first embodiment.

The semiconductor device of the second embodiment is a planar gate type vertical MOSFET 200 using silicon carbide. The MOSFET 200 is, for example, a DIMOSFET. In addition, the semiconductor device of the second embodiment includes an SBD as a built-in diode.

An intermediate region 103 of the MOSFET 200 includes a third connection layer 23. The third connection layer 23 includes a third connection layer 23a and a third connection layer 23b. Hereinafter, the third connection layer 23a and the third connection layer 23b may be collectively referred to as the third connection layer 23.

As shown in FIGS. 13A and 13B, the intermediate region 103 includes the third connection layer 23a for electrically connecting the source electrode 12 and the first portion 20a of the first wiring layer 20 to each other. The first portion 20a is separated in the second direction with the third connection layer 23a interposed therebetween. The two separated first portions 20a are electrically connected to each other by using, for example, the gate wiring layer 25 between the third connection layer 23a and the silicon carbide layer 10.

In addition, as shown in FIGS. 13A and 13B, the intermediate region 103 includes the third connection layer 23b for electrically connecting the source electrode 12 and the second portion 20b of the first wiring layer 20 to each other. The second portion 20b is separated in the second direction with the third connection layer 23b interposed therebetween. The two separated second portions 20b are electrically connected to each other by using the gate wiring layer 25 between the third connection layer 23b and the silicon carbide layer 10. The source electrode 12 is interposed between the third connection layer 23a and the third connection layer 23b.

By providing the third connection layer 23a, the voltage drop of the first portion 20a is suppressed when a surge voltage that makes the source electrode 12 positive is applied to the MOSFET 200. Similarly, by providing the third connection layer 23b, the voltage drop of the second portion 20b is suppressed when a surge voltage that makes the source electrode 12 positive is applied to the MOSFET 200. Therefore, the current flowing through the first wiring layer 20 is suppressed, and the fusing of the first wiring layer 20 is suppressed. As a result, the surge current withstand capacity of the MOSFET 200 is improved.

As described above, according to the second embodiment, a MOSFET in which the fusing of the wiring layer is suppressed and the surge current withstand capacity is improved is realized.

Third Embodiment

A semiconductor device of a third embodiment is different from the semiconductor device of the first embodiment in that the second wiring layer is provided between the second connection layer and the silicon carbide layer. Hereinafter, the description of a part of the content overlapping the first embodiment may be omitted.

Figure 14B:
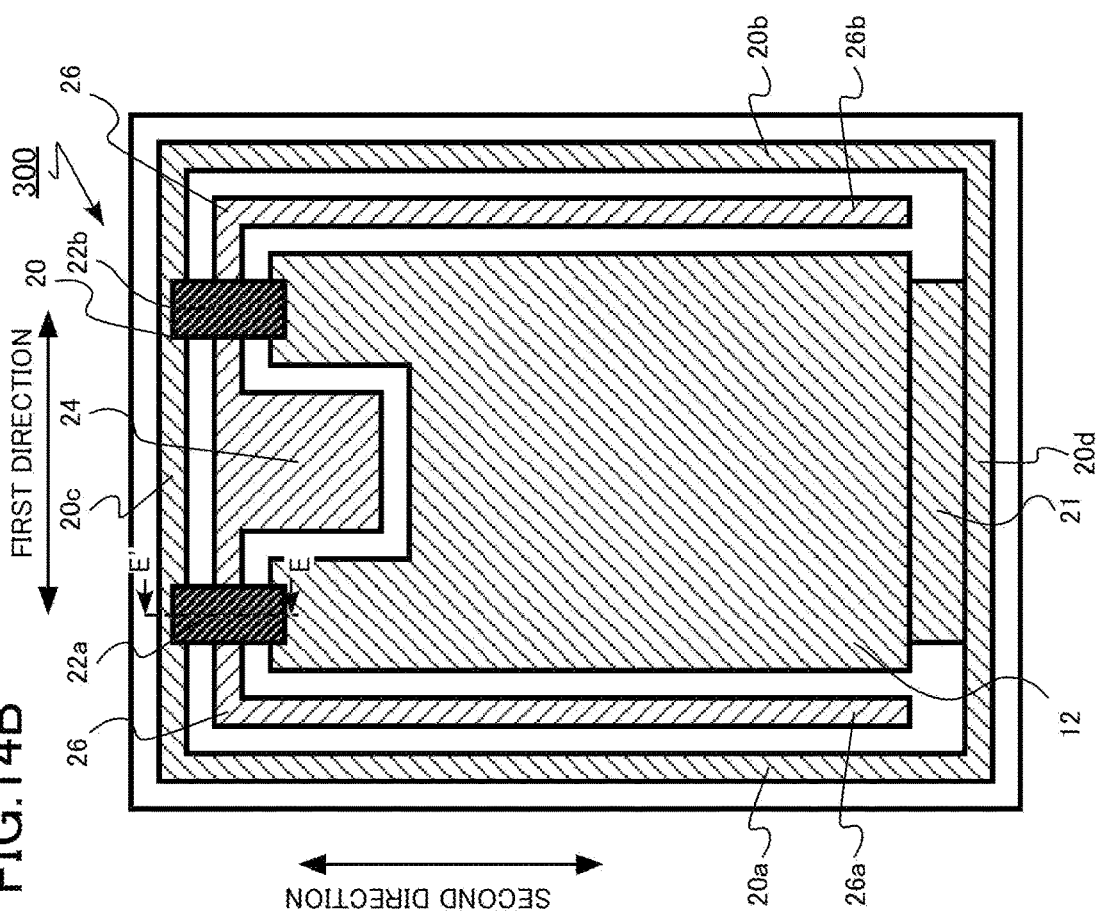
FIGS. 14A and 14B are schematic top views of a semiconductor device of a third embodiment.
Figure 14A:
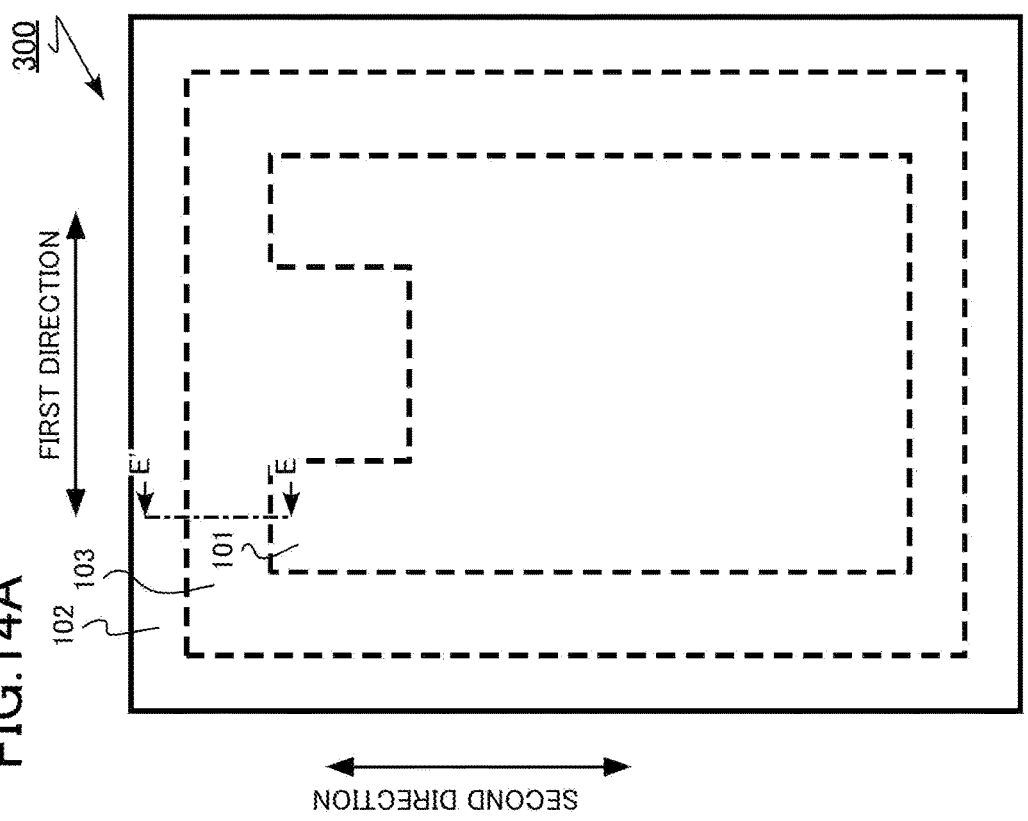

FIGS. 14A and 14B are schematic top views of the semiconductor device of the third embodiment. FIG. 14A shows a layout pattern of an element region, a termination region, and an intermediate region. FIG. 14B shows a layout pattern of a first electrode, a first wiring layer, a first connection layer, a second connection layer, a gate pad electrode, and a second wiring layer. FIGS. 14A and 14B are diagrams corresponding to FIGS. 1A and 1B of the first embodiment.

Figure 15:
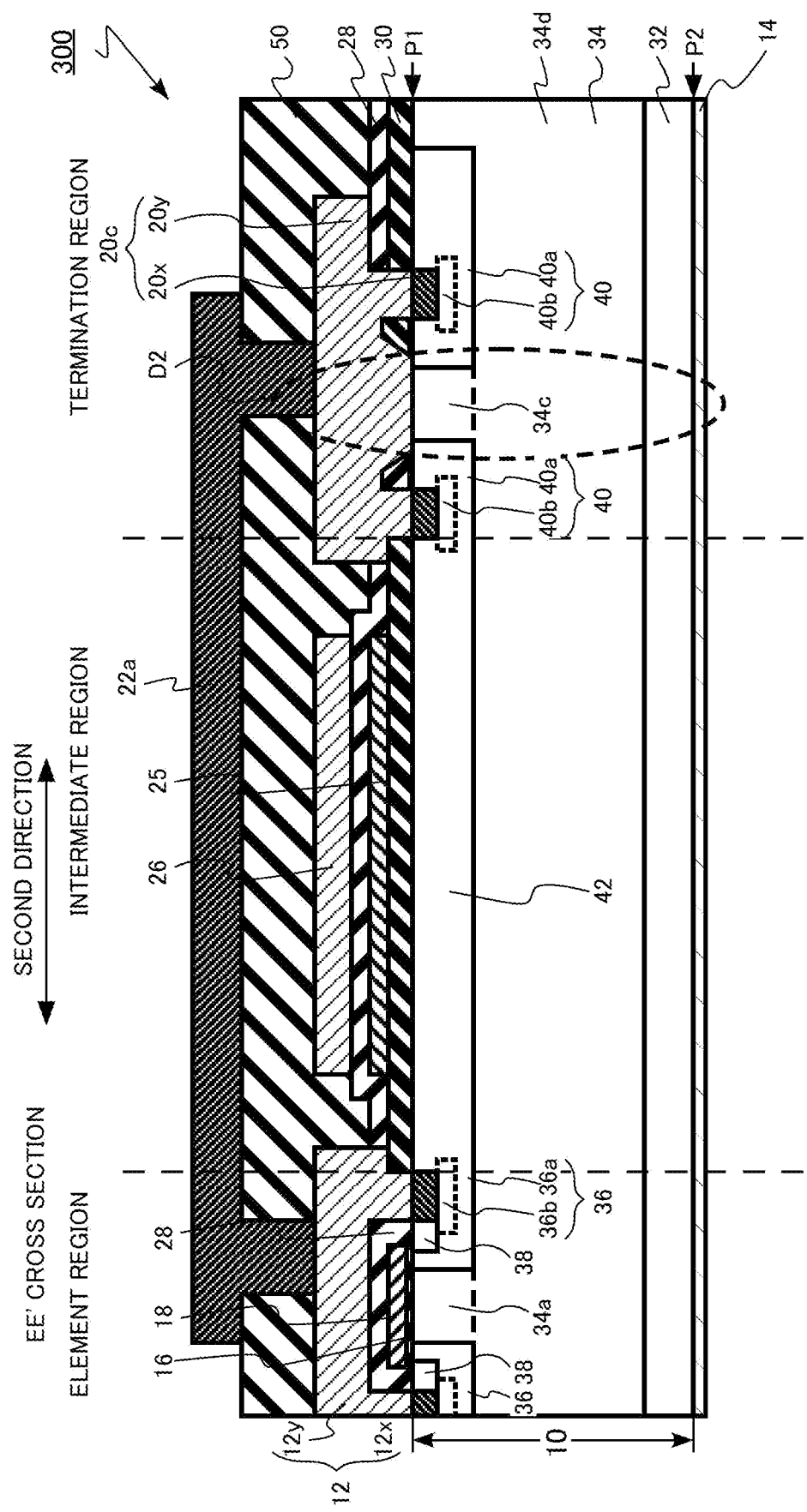
FIG. 15 is a schematic cross-sectional view of the semiconductor device of the third embodiment.

FIG. 15 is a schematic cross-sectional view of the semiconductor device of the third embodiment. FIG. 15 is a cross-sectional view taken along the line EE' of FIGS. 14A and 14B. FIG. 15 is a diagram corresponding to FIG. 8 of the first embodiment.

The semiconductor device of the third embodiment is a planar gate type vertical MOSFET 300 using silicon carbide. The MOSFET 300 is, for example, a DIMOSFET. In addition, the semiconductor device of the third embodiment includes an SBD as a built-in diode.

An intermediate region 103 of the MOSFET 300 includes a second connection layer 22. The second connection layer 22 includes a second connection layer 22a and a second connection layer 22b. Hereinafter, the second connection layer 22a and the second connection layer 22b may be collectively referred to as the second connection layer 22.

The intermediate region 103 of the MOSFET 300 includes a protective insulating layer 50. The protective insulating layer 50 is provided on the second wiring layer 26. The protective insulating layer 50 contains, for example, silicon oxide.

The protective insulating layer 50 is provided between the second connection layer 22 and the second wiring layer 26. The second wiring layer 26 is provided between the second connection layer 22 and the silicon carbide layer 10.

In the MOSFET 300 of the third embodiment, by providing the second connection layer 22, the voltage drop of the third portion 20c of the first wiring layer 20 with respect to the source electrode 12 is reduced. For this reason, when a surge voltage that makes the source electrode 12 positive is applied to the MOSFET 300, the current flowing through the first wiring layer 20 is suppressed. Therefore, the fusing of the first wiring layer 20 is suppressed. As a result, the surge current withstand capacity of the MOSFET 300 is improved.

As described above, according to the third embodiment, a MOSFET in which the fusing of the wiring layer is suppressed and the surge current withstand capacity is improved is realized.

Fourth Embodiment

A semiconductor device of a fourth embodiment includes: an element region including a transistor and a first diode; a termination region surrounding the element region and including a second diode; and an intermediate region provided between the element region and the termination region and not including the transistor, the first diode, and the second diode. The element region includes: a first electrode; a second electrode; a gate electrode extending in a first direction; a silicon carbide layer provided between the first electrode and the second electrode, having a first face on a side of the first electrode and parallel to the first direction and a second face on a side of the second electrode, and including: a first silicon carbide region of a first conductive type having a first region in contact with the first face and facing the gate electrode and a second region in contact with the first face and in contact with the first electrode; a second silicon carbide region of a second conductive type provided between the first silicon carbide region and the first face, adjacent to the first region, facing the gate electrode, and electrically connected to the first electrode; and a third silicon carbide region of a first conductive type provided between the second silicon carbide region and the first face and electrically connected to the first electrode; and a gate insulating layer provided between the gate electrode and the second silicon carbide region, between the gate electrode and the first region, and between the gate electrode and the third silicon carbide region. The termination region includes: the first electrode; the second electrode; and the silicon carbide layer including the first silicon carbide region having a third region in contact with the first face and in contact with the first electrode and a fourth silicon carbide region of a second conductive type provided between the first silicon carbide region and the first face and electrically connected to the first electrode. The intermediate region includes: a gate electrode pad; the first electrode; the second electrode; the silicon carbide layer including the first silicon carbide region and a fifth silicon carbide region of a second conductive type provided between the first silicon carbide region and the first face; and a gate wiring layer provided between the first electrode and the silicon carbide layer, electrically connected to the gate electrode pad and the gate electrode, and having a first gate line extending in a second direction parallel to the first face and perpendicular to the first direction and a second gate line extending in the second direction, the gate electrode being interposed between the first gate line and the second gate line. The transistor includes the gate electrode, the gate insulating layer, the first region, the second silicon carbide region, and the third silicon carbide region. The first diode includes the first electrode and the second region. The second diode includes the first electrode and the third region. An electrical resistance per unit length of the first gate line in the second direction is lower than an electrical resistance per unit length of the gate electrode in the first direction.

Figure 16B:
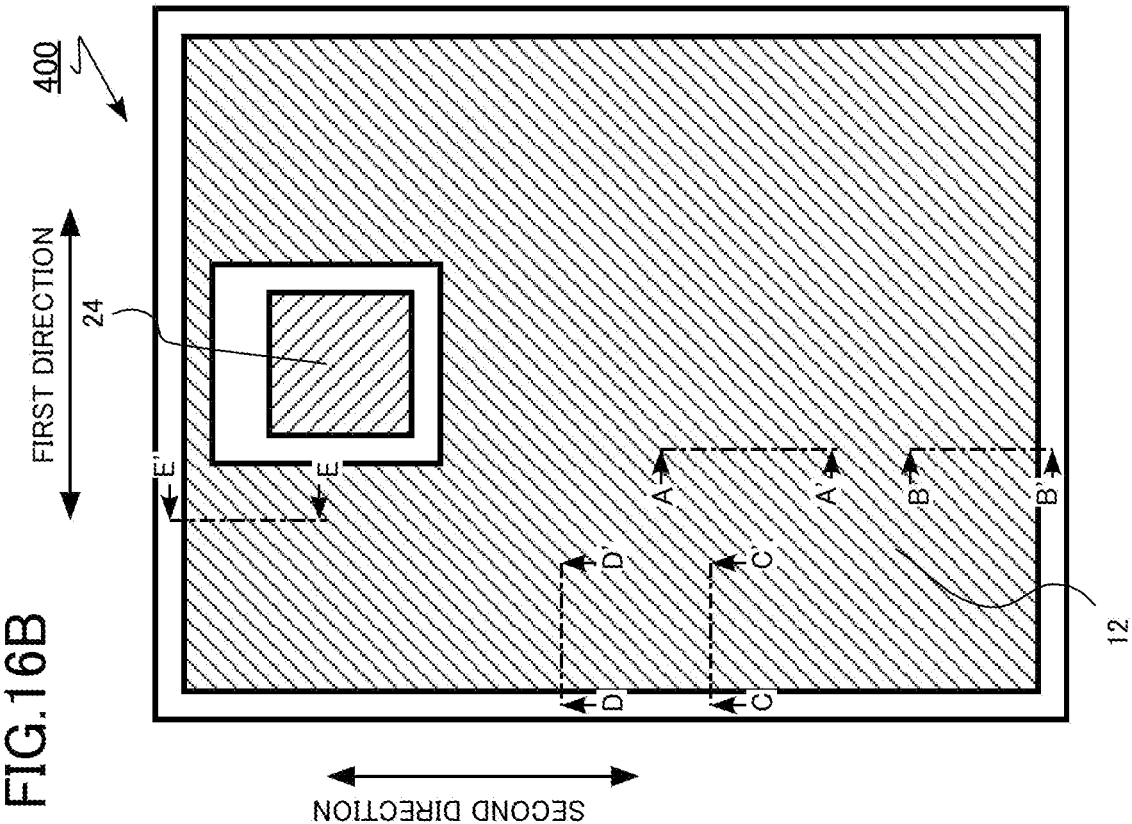
FIGS. 16A and 16B are schematic top views of a semiconductor device or a fourth embodiment.
Figure 16A:
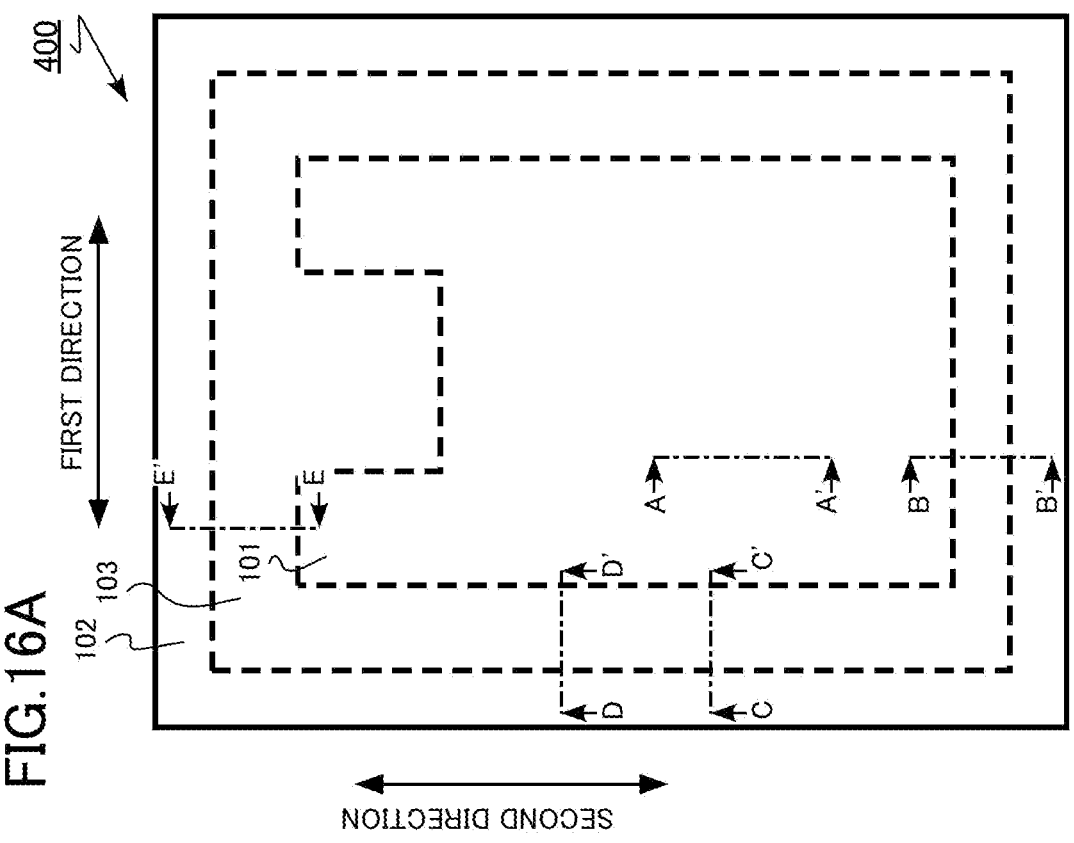

FIGS. 16A and 16B are schematic top views of the semiconductor device of the fourth embodiment. FIG. 16A shows a layout pattern of an element region, a termination region, and an intermediate region. FIG. 16B shows a layout pattern of a first electrode and a gate pad electrode.

FIGS. 17A and 17B are schematic top views of the semiconductor device of the fourth embodiment. FIG. 17A shows a layout pattern of an element region, a termination region, and an intermediate region. FIG. 17B shows a layout pattern of a gate electrode, a gate wiring layer, and a gate pad electrode.

Figure 18:
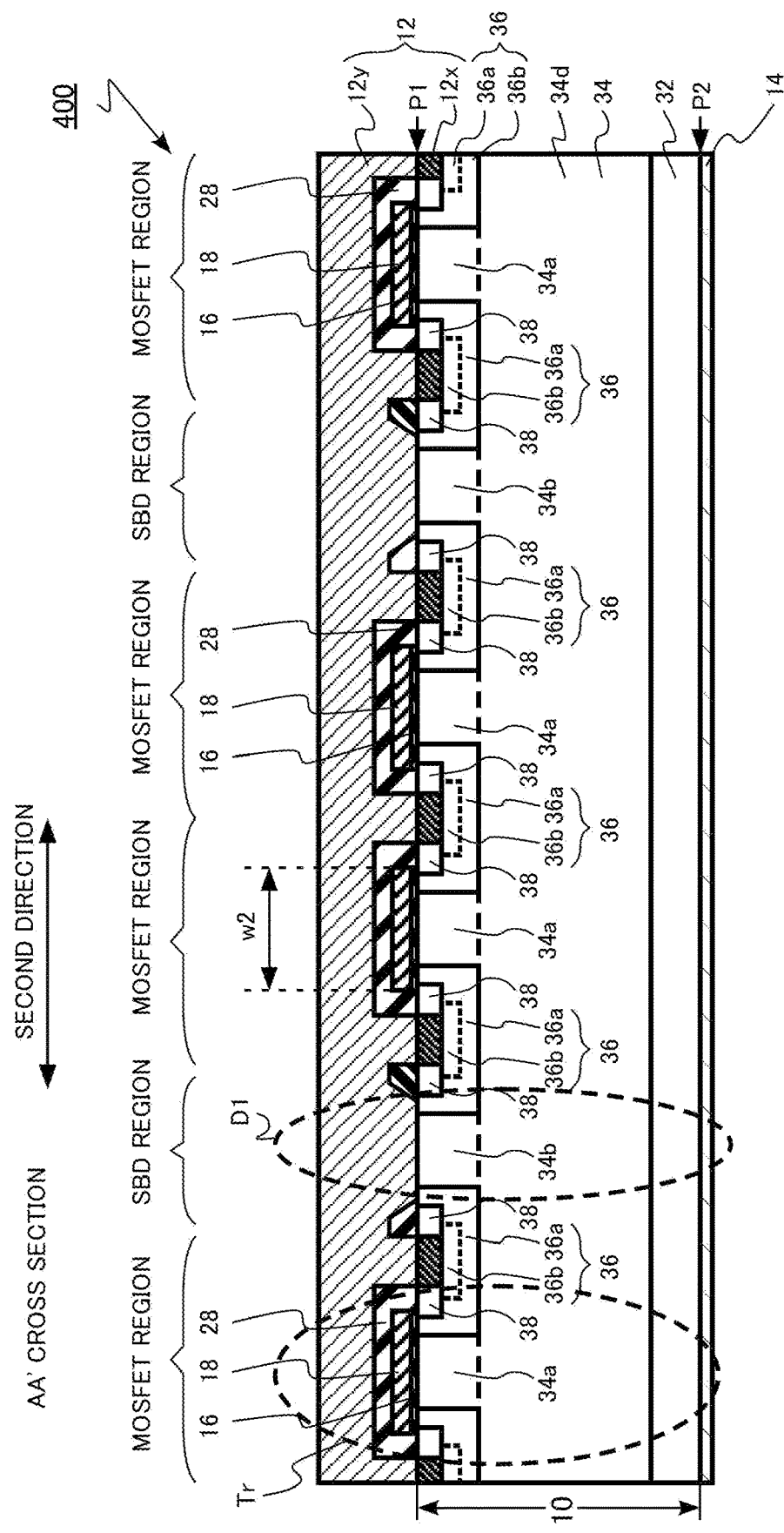
FIG. 18 is a schematic cross-sectional view of the semiconductor device of the fourth embodiment.

FIG. 18 is a schematic cross-sectional view of the semiconductor device of the fourth embodiment. FIG. 18 is a cross-sectional view taken along the line AA' of FIGS. 16A, 16B, 17A, and 17B.

Figure 19:
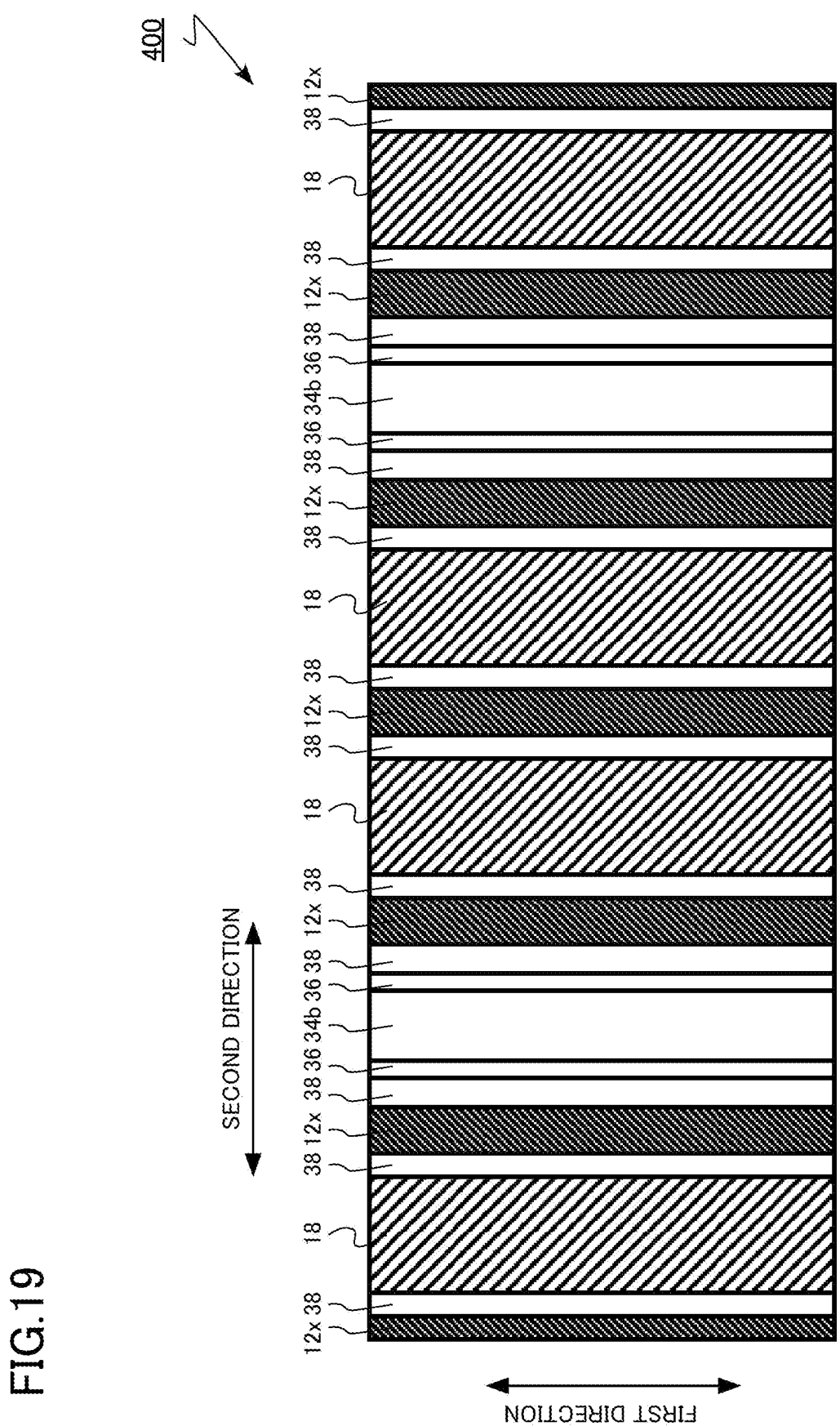
FIG. 19 is a schematic top view of the semiconductor device of the fourth embodiment.

FIG. 19 is a schematic top view of the semiconductor device of the fourth embodiment. FIG. 19 is a top view corresponding to FIG. 18. FIG. 19 shows a layout pattern on the side of a first face of a semiconductor layer. FIG. 19 shows a state in which a first electrode and an interlayer insulating layer are removed.

Figure 20:
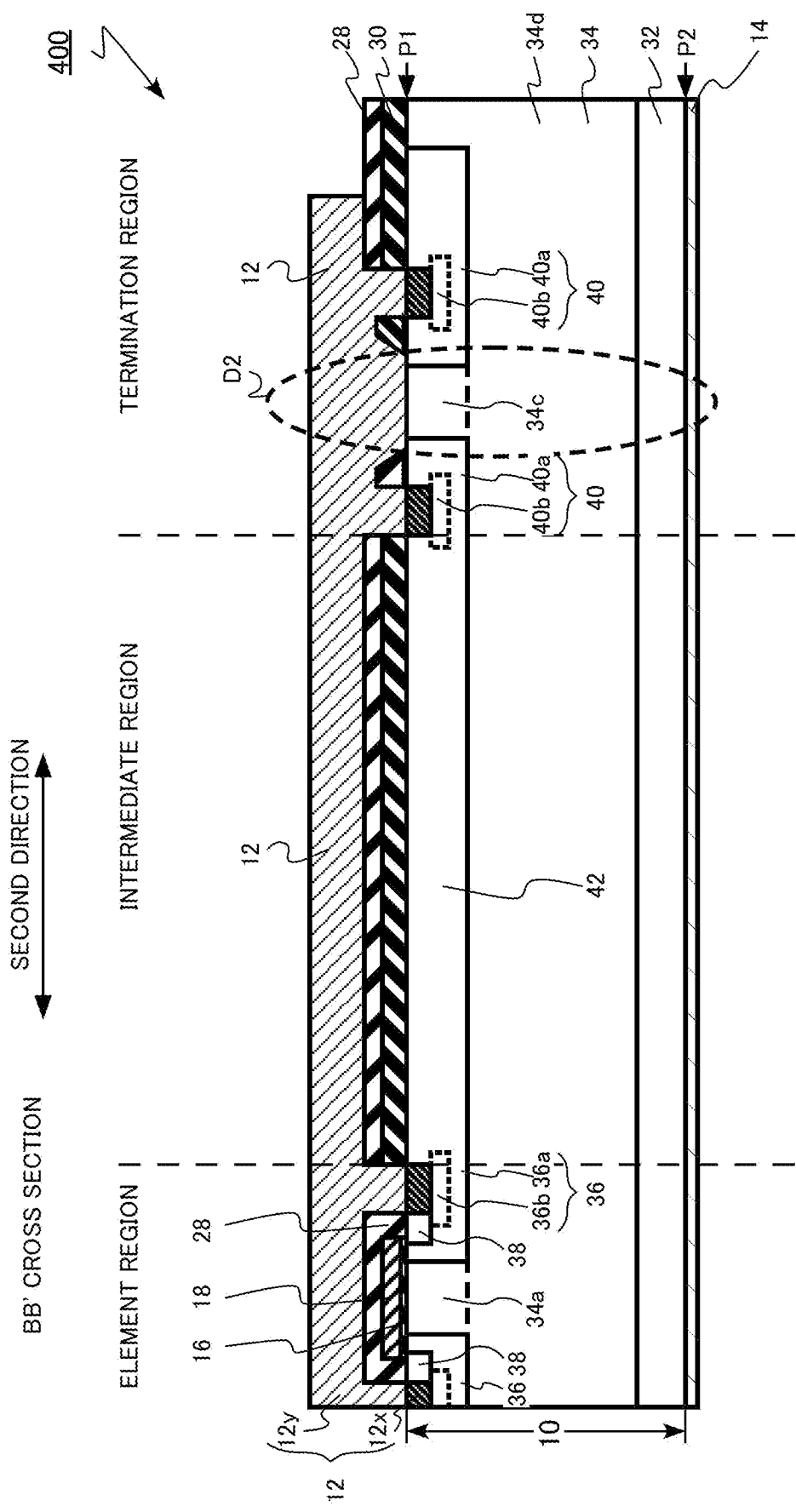
FIG. 20 is a schematic cross-sectional view of the semiconductor device of the fourth embodiment.

FIG. 20 is a schematic cross-sectional view of the semiconductor device of the fourth embodiment. FIG. 20 is a cross-sectional view taken along the line BB' of FIGS. 16A, 16B, 17A, and 17B.

Figure 21:
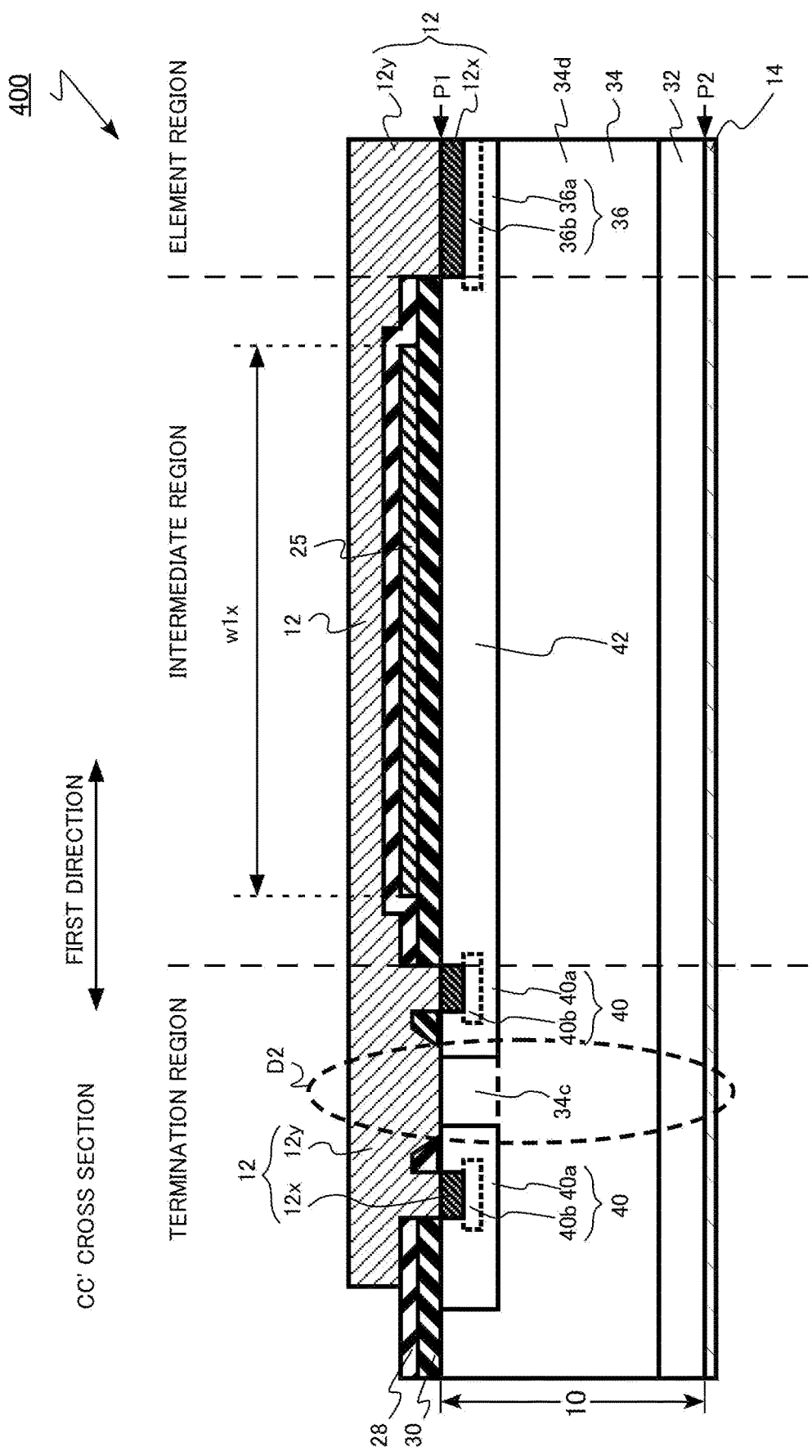
FIG. 21 is a schematic cross-sectional view of the semiconductor device of the fourth embodiment.

FIG. 21 is a schematic cross-sectional view of the semiconductor device of the fourth embodiment. FIG. 21 is a cross-sectional view taken along the line CC' of FIGS. 16A, 16B, 17A and 17B.

Figure 22:
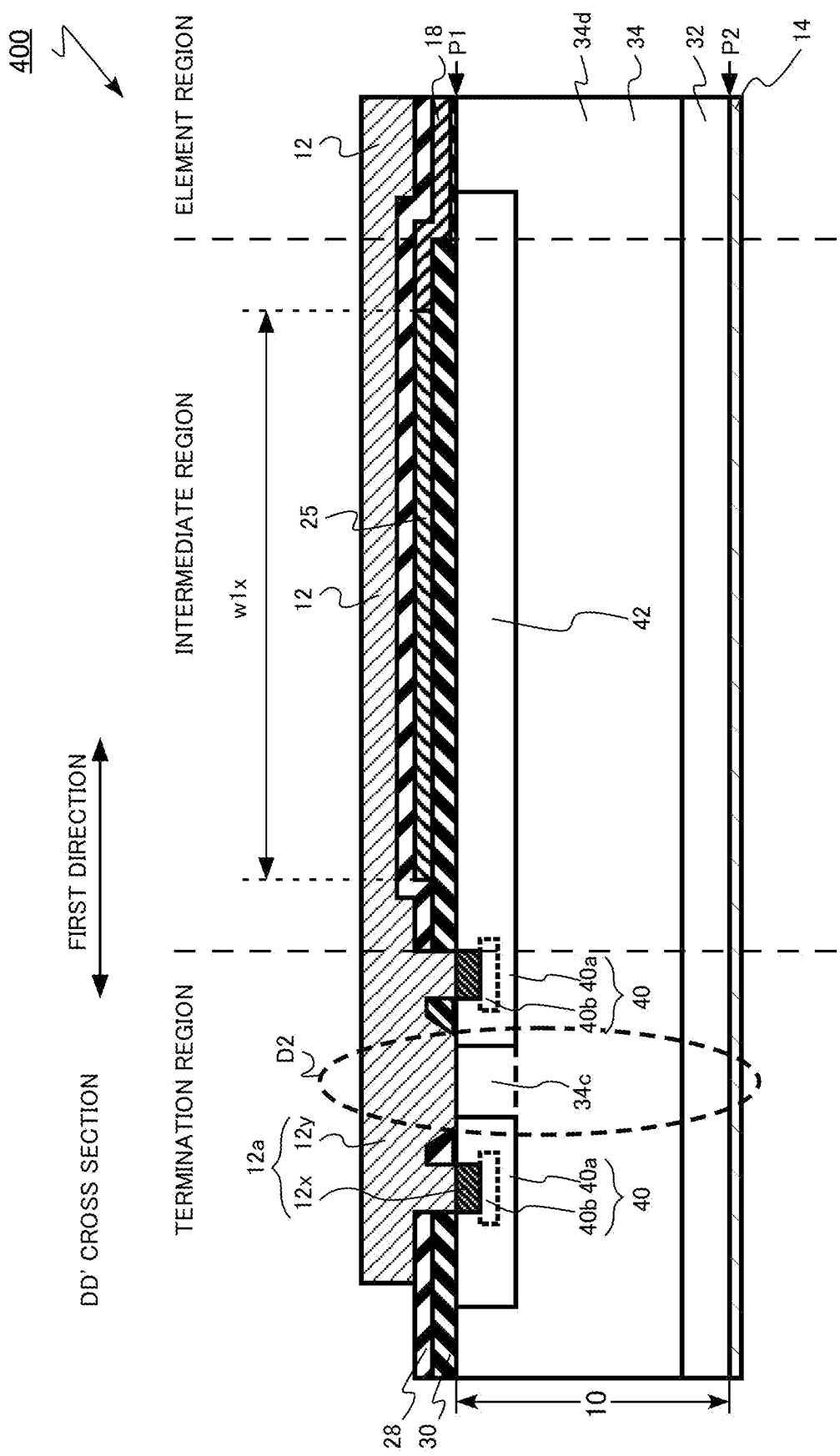
FIG. 22 is a schematic cross-sectional view of the semiconductor device of the fourth embodiment.

FIG. 22 is a schematic cross-sectional view of the semiconductor device of the fourth embodiment. FIG. 22 is a cross-sectional view taken along the line DD' of FIGS. 16A, 16B, 17A and 17B.

Figure 23:
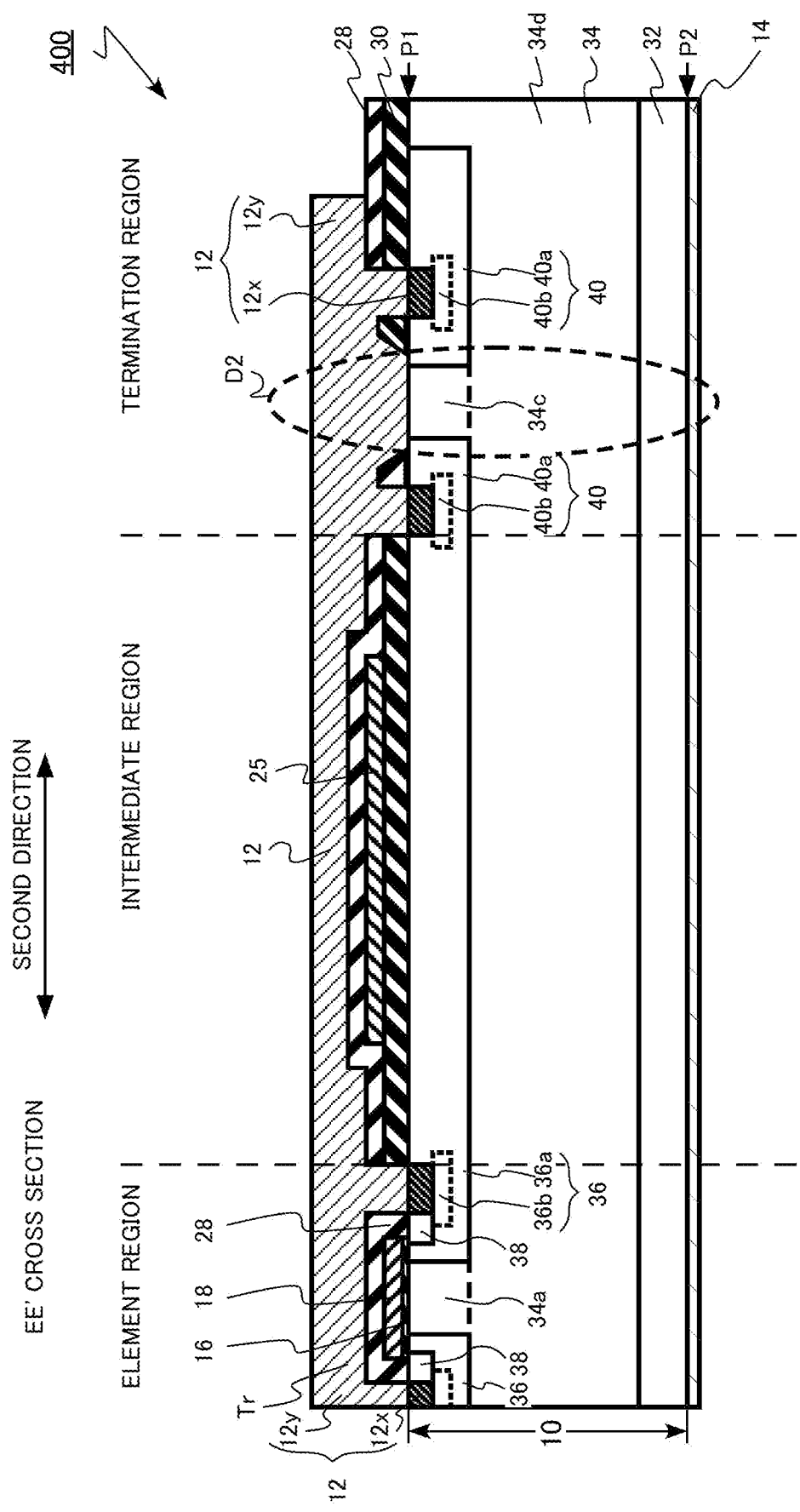
FIG. 23 is a schematic cross-sectional view of the semiconductor device of the fourth embodiment.

FIG. 23 is a schematic cross-sectional view of the semiconductor device of the fourth embodiment. FIG. 23 is a cross-sectional view taken along the line EE' of FIGS. 16A, 16B, 17A, and 17B.

The semiconductor device of the fourth embodiment is a planar gate type vertical MOSFET 400 using silicon carbide. The MOSFET 100 is, for example, a DIMOSFET in which a body region and a source region are formed by ion implantation. In addition, the semiconductor device of the fourth embodiment includes an SBD as a built-in diode.

Hereinafter, a case where the first conductive type is n-type and the second conductive type is p-type will be described as an example. The MOSFET 400 is a vertical n-channel MOSFET having electrons as carriers.

The MOSFET 400 includes an element region 101, a termination region 102, and an intermediate region 103.

The element region 101 includes a plurality of MOSFET regions and a plurality of SBD regions. The MOSFET region includes a transistor Tr. The SBD region includes a first diode D1. The termination region 102 includes a second diode D2.

The MOSFET 400 includes a silicon carbide layer 10, a source electrode 12 (first electrode), a drain electrode 14, a gate insulating layer 16, a gate electrode 18, a gate electrode pad 24, a gate wiring layer 25, an interlayer insulating layer 28, and a field insulating layer 30.

The source electrode 12 is an example of the first electrode. The drain electrode 14 is an example of the second electrode.

The silicon carbide layer 10 includes an $n^+$-type drain region 32, an $n^-$-type drift region 34 (first silicon carbide region), a p-type body region 36 (second silicon carbide region), an $n^+$-type source region 38 (third silicon carbide region), a p-type resurf region 40 (fourth silicon carbide region), and a p-type connection region 42 (fifth silicon carbide region). The drift region 34 has a JFET region 34a (first region), a first JBS region 34b (second region), a second JBS region 34c (third region), and a lower region 34d. The body region 36 has a low-concentration body region 36a and a high-concentration body region 36b. The resurf region 40 has a low-concentration resurf region 40a and a high-concentration resurf region 40b.

The drift region 34 is an example of the first silicon carbide region. The body region 36 is an example of the second silicon carbide region. The JFET region 34a is an example of the first region. The first JBS region 34b is an example of the second region. The second JBS region 34c is an example of a third region. The source region 33 is an example of the third silicon carbide region. The resurf region 40 is an example of the fourth silicon carbide region. The connection region 42 is an example of the fifth silicon carbide region.

As shown in FIG. 18, the element region 101 includes a plurality of MOSFET regions and a plurality of SBD regions. The MOSFET region includes a transistor Tr. The SBD region includes a1 first diode D1.

The MOSFET region extends in the first direction. The MOSFET region is repeatedly arranged in the second direction.

The SBD region extends in the first direction. The SBD region is repeatedly arranged in the second direction. Two MOSFET regions are provided between SBD regions adjacent to each other in the second direction. In the MOSFET 400, the ratio between the number of MOSFET regions and the number of SBD regions is 2:1.

The ratio between the number of MOSFET regions and the number of SBD regions is not limited to 2:1. For example, the ratio between the number of MOSFET regions and the number of SBD regions may be 1:1 or 3:1 or any other ratio.

As shown in FIGS. 16B, 17B, and 18, the element region 101 includes the silicon carbide layer 10, the source electrode 12 (first electrode), the drain electrode 14 (second electrode), the gate insulating layer 16, the gate electrode 18, and the interlayer insulating layer 28.

The silicon carbide layer 10 in the element region 101 is provided between the source electrode 12 and the drain electrode 14. The silicon carbide layer 10 is a single crystal SiC. The silicon carbide layer 10 is, for example, 4H—SiC.

The silicon carbide layer 10 includes a first face ("P1" in FIG. 18) and a second face ("P2" in FIG. 18). Hereinafter, the first face P1 may be referred to as a surface, and the second face P2 may be referred to as a back surface. The first face P1 is disposed on the source electrode 12 side of the silicon carbide layer 10. In addition, the second face P2 is disposed on the drain electrode 14 side of the silicon carbide layer 10. The first face P1 and the second face P2 face each other. Hereinafter, the "depth" means a depth in a direction toward the second face with the first face as a reference.

The first face is parallel to the first and second directions. The second direction is perpendicular to the first direction.

The first face P1 is, for example, a face inclined by an angle equal to or more than 0° and equal to or less than 8° with respect to the (0001) face. In addition, the second face P2 is, for example, a face inclined by an angle equal to or more than 0° and equal to or less than 8° with respect to the (000-1) face. The (0001) face is referred to as a silicon face. The (000-1) face is referred to as a carbon face.

The thickness of the silicon carbide layer 10 is equal to or more than 5 μm and equal to or less than 150 μm, for example.

As shown in FIG. 18, the silicon carbide layer 10 in the element region 101 includes the $n^+$-type drain region 32, the $n^-$-type drift region 34 (first silicon carbide region), the p-type body region 36 (second silicon carbide region), and the $n^+$-type source region 38 (third silicon carbide region). The drift region 34 has the JFET region 34a (first region), the first JBS region 34b (second region), and the lower region 34d. The body region 36 has the low-concentration body region 36a and the high-concentration body region 36b.

The $n^+$-type drain region 32 is provided on the back surface side of the silicon carbide layer 10. The drain region 32 contains, for example, nitrogen (N) as an n-type impurity. The n-type impurity concentration in the drain region 32 is equal to or more than $1\times10^{18}$ cm$^{-3}$ and equal to or less than $1\times10^{21}$ cm$^{-3}$, for example.

The $n^-$-type drift region 34 is provided between the drain region 32 and the first face P1. The $n^-$-type drift region 34 is provided between the source electrode 12 and the drain electrode 14. The $n^-$-type drift region 34 is provided between the gate electrode 18 and the drain electrode 14.

The $n^-$-type drift region 34 is provided on the drain region 32. The drift region 34 contains, for example, nitrogen (N) as an n-type impurity. The n-type impurity concentration in the drift region 34 is lower than the n-type impurity concentration in the drain region 32. The n-type impurity concentration in the drift region 34 is equal to or more than $4\times10^{14}$ cm$^{-3}$ and equal to or less than $1\times10^{17}$ cm$^{-3}$, for example. The thickness of the drift region 34 is equal to or more than 5 μm and equal to or less than 150 μm, for example.

The n$^-$-type drift region 34 has the JFET region 34a, the first JBS region 34b, and the lower region 34d.

The JFET region 34a is provided be tween the lower region 34d and the first face P1. The JFET region 34a is in contact with the first face P1. The JFET region 34a is provided between two adjacent body regions 36.

The JFET region 34a extends in the first direction. The JFET region 34a faces the gate electrode 18 with the gate insulating layer 16 interposed therebetween.

The JFET region 34a functions as a current path for the MOSFET 400. The n-type impurity concentration in the JFET region 34a is higher than, for example, the n-type impurity concentration in the lower region 34d. The n-type impurity concentration in the JFET region 34a is equal to or more than $5\times10^{16}$ cm$^{-3}$ and equal to or less than $2\times10^{17}$ cm$^{-3}$, for example.

The first JBS region 34b is provided between the lower region 34d and the first face P1. The first JBS region 34b is in contact with the first face P1. The first JBS region 34b is provided between the two body regions 36 adjacent to each other.

The first JBS region 34b extends in the first direction. The first JBS region 34b is in contact with the source electrode 12.

The first diode D1 is an SBD. The n-type impurity concentration in the first JBS region 34b is higher than, for example, the n-type impurity concentration in the lower region 34d. The n-type impurity concentration in the first JBS region 34b is equal to or more than $5\times10^{16}$ cm$^{-3}$ and equal to or less than $2\times10^{17}$ cm$^{-3}$, for example.

The p-type body region 36 is provided between the drift region 34 and the first face P1. The body region 36 extends in the first direction. The body region 36 functions as a channel region of the MOSFET 400. The body region 36 functions as a channel region of the transistor Tr.

The depth of the body region 36 is equal to or more than 0.5 μm and equal to or less than 1.0 μm, for example.

The body region 36 is electrically connected to the source electrode 12. The body region 36 is fixed to the electric potential of the source electrode 12.

A part of the body region 36 is in contact with the first face P1. A part of the body region 36 faces the gate electrode 18. A part of the body region 36 becomes a channel region of the MOSFET 400. The gate insulating layer 16 is interposed between a part of the body region 36 and the gate electrode 18.

The body region 36 is adjacent to the JFET region 34a. The body region 36 is in contact with the JFET region 34a.

The body region 36 has the low-concentration body region 36a and the high-concentration body region 36b. The high-concentration body region 36b is provided between the low-concentration body region 36a and the source electrode 12. The high-concentration body region 36b is in contact with the source electrode 12.

The body region 36 contains, for example, aluminum (Al) as a p-type impurity. The p-type impurity concentration in the low-concentration body region 36a is lower than the p-type impurity concentration in the high-concentration body region 36b. The p-type impurity concentration in the low-concentration body region 36a is equal to or more than $5\times10^{17}$ cm$^{-3}$ and equal to or less than $5\times10^{19}$ cm$^{-3}$, for example. The p-type impurity concentration in the high-concentration body region 36b is equal to or more than $1\times10^{19}$ cm$^{-3}$ and equal to or less than $1\times10^{21}$ cm$^{-3}$, for example.

The body region 36 is electrically connected to the source electrode 12. The contact between the body region 36 and the source electrode 12 is, for example, an ohmic contact. The body region 36 is fixed to the electric potential of the source electrode 12.

The n$^+$-type source region 38 is provided between the body region 36 and the first face P1. The source region 38 extends in the first direction.

The source region 38 contains, for example, phosphorus (P) or nitrogen (N) as an n-type impurity. The n-type impurity concentration in the source region 38 is higher than the n-type impurity concentration in the drift region 34.

The n-type impurity concentration in the source region 38 is equal to or more than $1\times10^{19}$ cm$^{-3}$ and equal to or less than $1\times10^{21}$ cm$^{-3}$, for example. The depth of the source region 38 is smaller than the depth of the body region 36. The depth of the source region 38 is equal to or more than 0.05 μm and equal to or less than 0.2 μm, for example.

The source region 38 is in contact with the source electrode 12. The source region 38 is electrically connected to the source electrode 12. The contact between the source region 36 and the source electrode 12 is, for example, an ohmic contact. The source region 33 is fixed to the electric potential of the source electrode 12.

The gate electrode 13 is provided on the first face P1 of the silicon carbide layer 10. The gate electrode 18 extends in the first direction. A plurality of gate electrodes 18 are arranged in parallel with each other in the second direction. The gate electrode 18 has a striped shape.

The gate electrode 18 is a conductive layer. The gate electrode 18 is, for example, polycrystalline silicon containing p-type impurities or n-type impurities.

The gate electrode 18 faces the body region 36. The gate electrode 18 faces the JFET region 34a.

The gate insulating layer 16 is provided between the gate electrode 18 and the body region 36. The gate insulating layer 16 is provided between the gate electrode 18 and the JFET region 34a. The gate insulating layer 16 is provided between the gate electrode 18 and the source region 38.

The gate insulating layer 16 is, for example, silicon oxide. For example, a high-k insulating material (insulating material with a high dielectric constant) can be applied to the gate insulating layer 16.

The interlayer insulating layer 28 is provided on the gate electrode 18 and the silicon carbide layer 10. The interlayer insulating layer 28 is, for example, silicon oxide.

The source electrode 12 is in contact with the silicon carbide layer 10. The source electrode 12 is in contact with the source region 38. The source electrode 12 is in contact with the body region 36. The source electrode 12 is in contact with the high-concentration body region 36b. The source electrode 12 is in contact with the first JBS region 34b.

The source electrode 12 has, for example, a silicide layer 12x and a metal layer 12y. The silicide layer 12x is provided between the silicon carbide layer 10 and the metal layer 12y. The silicide layer 12x extends in the first direction.

The silicide layer 12x is in contact with the source region 38. The silicide layer 12x is in contact with the body region 36. The silicide layer 12x is in contact with the high-concentration body region 36b.

The source electrode 12 functions as an anode of the first diode D1.

The suicide layer 12x of the source electrode 12 contains silicide. The silicide layer 12x is, for example, nickel silicide or titanium silicide.

The contact between the source electrode 12 and the source region 38 becomes an ohmic contact by providing the silicide layer 12x. The contact between the source electrode 12 and the body region 36 becomes an ohmic contact by providing the silicide layer 12x. The contact between the source electrode 12 and the high-concentration body region 36b becomes an ohmic contact by providing the suicide layer 12x.

The metal layer 12y of the source electrode 12 contains metal. The metal layer 12y has, for example, a stacked structure of titanium (Ti) and aluminum (Al).

The metal layer 12y is in contact with the first JBS region 34b. The contact between the source electrode 12 and the first JBS region 34b is a Schottky contact. The contact between the metal layer 12y and the first JBS region 34b is a Schottky contact.

The drain electrode 14 is provided on the back surface of the silicon carbide layer 10. The drain electrode 14 is in contact with the drain region 32.

The drain electrode 14 is, for example, a metal or a metal semiconductor compound. The drain electrode 14 contains at least one material selected from a group consisting of nickel silicide, titanium (Ti), nickel (Ni), silver (Ag), and gold (Au), for example.

As shown in FIG. 18, the transistor Tr includes the gate electrode 18, the gate insulating layer 16, the JFET region 34a, the body region 36, the source region 38, the source electrode 12, and the drain electrode 14. When the MOSFET 400 is in the ON state, a current flows from the drain electrode 14 to the source electrode 12 due to the transistor Tr.

As shown in FIG. 18, the first diode D1 includes the source electrode 12, the first JBS region 34b, and the drain electrode 14. When a forward bias is applied to the first diode D1, a current flows from the source electrode 12 to the drain electrode 14.

The termination region 102 surrounds the element region 101, as shown in FIG. 16A. The termination region 102 includes the second diode D2. The termination region 102 has a function of increasing the dielectric breakdown voltage of the MOSFET 400 by reducing the strength of the electric field applied to the termination portion of the pn junction in the element region 101 when the MOSFET 400 is in the off state.

As shown in FIGS. 16B, 20, 21, 22, and 23, the termination region 102 includes the silicon carbide layer 10, the source electrode 12 (first electrode), the drain electrode 14 (second electrode), the interlayer insulating layer 28, and the field insulating layer 30.

The silicon carbide layer 10 in the termination region 102 is provided between the source electrode 12 and the drain electrode 14.

As shown in FIGS. 20 to 23, the silicon carbide layer 10 in the termination region 102 includes the n$^+$-type drain region 32, the n$^-$-type drift region 34 (first silicon carbide region), and the p-type resurf region 40 (fourth silicon carbide region). The drift region 34 has the second JBS region 34c (third region) and the lower region 34d. The resurf region 40 has the low-concentration resurf region 40a and the high-concentration resurf region 40b.

The n$^+$-type drain region 32 is provided on the back surface side of the silicon carbide layer 10. The drain region 32 contains, for example, nitrogen (N) as an n-type impurity.

The n$^-$-type drift region 34 is provided between the drain region 32 and the first face P1. The n$^-$-type drift region 34 is provided between the source electrode 12 and the drain electrode 14.

The n$^-$-type drift region 34 is provided on the drain region 32. The drift region 34 contains, for example, nitrogen (N) as an n-type impurity.

The n$^-$-type drift region 34 has the second JBS region 34c and the lower region 34d.

The second JBS region 34c is provided between the lower region 34d and the first face P1. The second JBS region 34c is in contact with the first face P1. The second JBS region 34c is provided between the two resurf regions 40 adjacent to each other. The second JBS region 34c is in contact with the source electrode 12.

The second diode D2 is an SBD. The n-type impurity concentration in the second JBS region 34c is higher than, for example, the n-type impurity concentration in the lower region 34d. The n-type impurity concentration in the second JBS region 34c is equal to or more than $5\times10^{16}$ cm$^{-3}$ and equal to or less than $2\times10^{17}$ cm$^{-3}$, for example.

The p-type resurf region 40 is provided between the drift region 34 and the first face P1. The depth of the resurf region 40 is equal to or more than 0.5 μm and equal to or less than 1.0 μm, for example.

The resurf region 40 is electrically connected to the first wiring layer 20. The contact between the resurf region 40 and the source electrode 12 is, for example, an ohmic contact. The resurf region 40 is fixed to the electric potential of the source electrode 12.

The resurf region 40 has the low-concentration resurf region 40a and the high-concentration resurf region 40b. The high-concentration resurf region 40b is provided between the low-concentration resurf region 40a and the source electrode 12. The high-concentration resurf region 40b is in contact with the source electrode 12.

The resurf region 40 contains, for example, aluminum (Al) as a p-type impurity. The p-type impurity concentration in the low-concentration resurf region 40a is lower than the p-type impurity concentration in the high-concentration resurf region 40b. The p-type impurity concentration in the low-concentration resurf region 40a is equal to or more than $5\times10^{17}$ cm$^{-3}$ and equal to or less than $5\times10^{19}$ cm$^{-3}$, for example. The p-type impurity concentration in the high-concentration resurf region 40b is equal to or more than $1\times10^{19}$ cm$^{-3}$ and equal to or less than $1\times10^{21}$ cm$^{-3}$, for example.

The interlayer insulating layer 28 is provided on the field insulating layer 30. The interlayer insulating layer 28 is, for example, silicon oxide.

The field insulating layer 30 is provided on the silicon carbide layer 10. The field insulating layer 30 is, for example, silicon oxide.

The source electrode 12 has, for example, a silicide layer 12x and a metal layer 12y. The silicide layer 12x is provided between the silicon carbide layer 10 and the metal layer 12y.

The silicide layer 12x is in contact with the resurf region 40. The silicide layer 12x is in contact with the high-concentration resurf region 40b.

The source electrode 12 functions as an anode of the second diode D2.

The silicide layer 12x of the source electrode 12 contains silicide. The silicide layer 12x is, for example, nickel silicide or titanium silicide.

The contact between the source electrode 12 and the resurf region 40 becomes an ohmic contact by providing the silicide layer 12x. The contact between the source electrode 12 and the high-concentration resurf region 40b becomes an ohmic contact by providing the silicide layer 12x.

The metal layer 12y of the source electrode 12 contains metal. The metal layer 12y has, for example, a stacked structure of titanium (Ti) and aluminum (Al).

The metal layer 12y is in contact with the second JBS region 34c. The contact between the source electrode 12 and the first JBS region 34b is a Schottky contact. The contact between the metal layer 12y and the second JBS region 34c is a Schottky contact.

The drain electrode 14 is provided on the back surface of the silicon carbide layer 10. The drain electrode 14 is in contact with the drain region 32.

As shown in FIGS. 20 to 23, the second diode D2 includes the source electrode 12, the second JBS region 34c, and the drain electrode 14. When a forward bias is applied to the second diode D2, a current flows from the source electrode 12 to the drain electrode 14.

As shown in FIG. 16A, the intermediate region 103 is provided between the element region 101 and the termination region 102. The intermediate region 103 surrounds the element region 101. The termination region 102 surrounds the intermediate region 103.

The intermediate region 103 does not include the transistor Tr, the first diode D1, and the second diode D2.

As shown in FIGS. 16B, 17B, and 20 to 23, the intermediate region 103 includes the silicon carbide layer 10, the source electrode 12, the gate electrode pad 24, the gate wiring layer 25, the drain electrode 14 (second electrode), the interlayer insulating layer 28, and the field insulating layer 30.

The silicon carbide layer 10 the intermediate region 103 is provided between the source electrode 12 and the drain electrode 14 and between the gate electrode pad 24 and the drain electrode 14.

As shown in FIGS. 20 to 23, the silicon carbide layer 10 in the intermediate region 103 includes the n$^+$-type drain region 32, the n$^-$-type drift region 34 (first silicon carbide region), and the p-type connection region 42 (fifth silicon carbide region).

The n$^+$-type drain region 32 is provided on the back surface side of the silicon carbide layer 10. The drain region 32 contains, for example, nitrogen (N) as an n-type impurity.

The n$^-$-type drift region 34 is provided between the drain region 32 and the first face P1. The n$^-$-type drift region 34 is provided between the source electrode 12 and the drain electrode 14.

The n$^-$-type drift region 34 is provided on the drain region 32. The drift region 34 contains, for example, nitrogen (N) as an n-type impurity.

The n$^-$-type drift region 34 has the lower region 34d.

The p-type connection region 42 is provided between the drift region 34 and the first face P1. The depth of the connection region 42 is equal to or more than 0.5 μm and equal to or less than 1.0 μm, for example.

The connection region 42 is provided between the body region 36 and the resurf region 40. The connection region 42 is in contact with, for example, the body region 36. The connection region 42 is in contact with, for example, the resurf region 40. The connection region 42, the body region 36, and the resurf region 40 are, for example, continuous. The connection region 42, the body region 36, and the resurf region 40 are simultaneously formed by using, for example, the same manufacturing process.

The connection region 42 is electrically connected to the source electrode 12 through the body region 36, for example. The connection region 42 is electrically connected to the source electrode 12 through, for example, the resurf region 40. The connection region 42 is fixed to, for example, the electric potential of the source electrode 12.

The connection region 42 contains, for example, aluminum (Al) as a p-type impurity. The p-type impurity concentration in the connection region 42 is equal to or more than $5\times10^{17}$ cm$^{-3}$ and equal to or less than $5\times10^{19}$ cm$^{-3}$, for example.

The gate wiring layer 25 is provided between the source electrode 12 and the silicon carbide layer 10. The gate wiring layer 25 is electrically connected to the gate electrode pad 24. The gate wiring layer 25 is electrically connected to the gate electrode 18. The gate wiring layer 25 is in contact with, for example, the gate electrode 18.

The gate wiring layer 25 includes a first gate line 25a extending in the second direction and a second gate line 25b extending in the second direction. The gate electrode 18 is interposed between the first gate line 25a and the second gate line 25b.

The gate wiring layer 25 is a conductive layer. The gate wiring layer 25 is, for example, polycrystalline silicon containing p-type impurities or n-type impurities. The gate wiring layer 25 has, for example, a stacked structure of polycrystalline silicon containing p-type impurities or n-type impurities and silicide.

The electrical resistance per unit length of the gate wiring layer 25 in the second direction is lower than the electrical resistance per unit length of the gate electrode 18 in the first direction. The unit length is, for example, an arbitrary length equal to or more than 1 μm and equal to or less than 100 μm.

For example, the electrical resistance per unit length of the first gate line 25a in the second direction is lower than the electrical resistance per unit length of the gate electrode 18 in the first direction. In addition, for example, the electrical resistance per unit length of the second gate line 25b in the second direction is lower than the electrical resistance per unit length of the gate electrode 18 in the first direction.

For example, the width of the gate wiring layer 25 in the first direction is equal to or more than 20 times and equal to or less than 100 times the width of the gate electrode 18 in the second direction. For example, the width (w1x in FIG. 17B) of the first gate line 25a in the first direction is equal to or more than 20 times and equal to or less than 100 times the width (w2 in FIG. 17B) of the gate electrode 18 in the second direction. For example, the width (w2x in FIG. 17B) of the second gate line 25b in the first direction is equal to or more than 20 times and equal to or less than 100 times the width (w2 in FIG. 17B) of the gate electrode 18 in the second direction.

By setting the width of the gate wiring layer 25 in the first direction to be equal to or more than 20 times the width of the gate electrode 18 in the second direction, the electrical resistance per unit length of the gate wiring layer 25 in the second direction becomes lower than the electrical resistance per unit length of the gate electrode 18 in the first direction.

For example, the sheet resistance of the gate wiring layer 25 is lower than the sheet resistance of the gate electrode 18. For example, the sheet resistance of the first gate line 25a is lower than the sheet resistance of the gate electrode 18. In addition, for example, the sheet resistance of the second gate line 25b is lower than the sheet resistance of the gate electrode 18.

By setting the sheet resistance of the gate wiring layer 25 to be lower than the sheet resistance of the gate electrode 18, the electrical resistance per unit length of the gate wiring layer 25 in the second direction becomes lower than the electrical resistance per unit length of the gate electrode 18 in the first direction.

For example, the gate wiring layer 25 is polycrystalline silicon containing n-type impurities, and the gate electrode 18 is polycrystalline silicon containing p-type impurities. For example, the first gate line 25a is polycrystalline silicon containing n-type impurities, and the gate electrode 18 is polycrystalline silicon containing p-type impurities. In addition, for example, the second gate line 25b is polycrystalline silicon containing n-type impurities, and the gate electrode 18 is polycrystalline silicon containing p-type impurities.

The n-type impurity is, for example, phosphorus (P) or arsenic (As). The p-type impurity is, for example, boron (B).

By using polycrystalline silicon containing n-type impurities for the gate wiring layer 25 and polycrystalline silicon containing p-type impurities for the gate electrode 18, it becomes easy to make the sheet resistance of the gate wiring layer 25 lower than the sheet resistance of the gate electrode 18. Therefore, it becomes easy to make the electrical resistance per unit length of the gate wiring layer 25 in the second direction lower than the electrical resistance per unit length of the gate electrode 18 in the first direction.

For example, the gate wiring layer 25 has a stacked structure of polycrystalline silicon containing n-type impurities or p-type impurities and silicide, and the gate electrode 18 has a single-layer structure of polycrystalline silicon containing n-type impurities or p-type impurities. For example, the first gate line 25a has a stacked structure of polycrystalline silicon containing n-type impurities or p-type impurities and silicide, and the gate electrode 18 has a single-layer structure of polycrystalline silicon containing n-type impurities or p-type impurities. In addition, for example, the second gate line 25b has a stacked structure of polycrystalline silicon containing n-type impurities or p-type impurities and silicide, and the gate electrode 18 has a single-layer structure of polycrystalline silicon containing n-type impurities or p-type impurities.

By making the gate wiring layer 25 have a stacked structure of polycrystalline silicon containing n-type impurities or p-type impurities and silicide and the gate electrode 18 have a single-layer structure of polycrystalline silicon containing n-type impurities or p-type impurities, it becomes easy to make the sheet resistance of the gate wiring layer 25 lower than the sheet resistance of the gate electrode 18. Therefore, it becomes easy to make the electrical resistance per unit length of the gate wiring layer 25 in the second direction lower than the electrical resistance per unit length of the gate electrode 18 in the first direction.

The interlayer insulating layer 28 is provided on the field insulating layer 30. The interlayer insulating layer 28 is, for example, silicon oxide.

The field insulating layer 30 is provided on the silicon carbide layer 10. The field insulating layer 30 is, for example, silicon oxide.

The gate electrode pad 24 is provided on the first face P1 side of the silicon carbide layer 10. The gate electrode pad 24 contains metal. The gate electrode pad 24 has, for example, a stacked structure of titanium (Ti) and aluminum (Al).

The gate electrode 18 provided in the element region 101 is electrically connected to the gate electrode pad 24 through the gate wiring layer 25.

The drain electrode 14 is provided on the back surface of the silicon carbide layer 10. The drain electrode 14 is in contact with the drain region 32.

Next, the function and effect of the MOSFET 400 of the fourth embodiment will be described.

In the MOSFET 400, as in the MOSFET 100 of the first embodiment, a pn junction diode and an SBD are connected as built-in diodes in parallel with a transistor between the source electrode 12 and the drain electrode 14 in the element region 101. Therefore, in the reverse conduction state, a forward current flows through the SBD, and the growth of a stacking fault due to the operation of the pn junction diode is suppressed. As a result, as in the MOSFET 100, the increase in the on-resistance is suppressed to improve the reliability of the MOSFET 400.

A high surge voltage that momentarily makes the source electrode positive may be applied between the source electrode and the drain electrode of the MOSFET. When a high surge voltage is applied, a large surge current flows through the MOSFET, and the MOSFET may break down.

The maximum allowable peak current value of the surge current allowed in the MOSFET is referred to as a surge current withstand capacity. In a MOSFET in which the SBD is provided, it is desired to improve the surge current withstand capacity from the viewpoint of improving reliability.

Figure 24B:
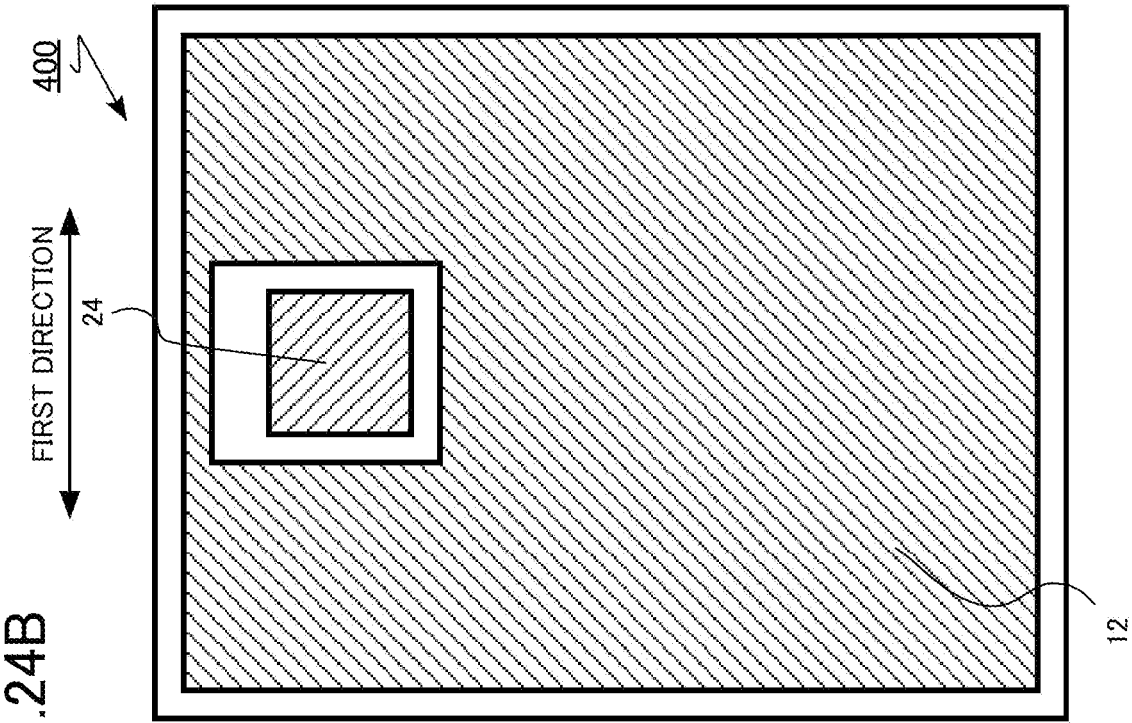
FIGS. 24A and 24B are explanatory diagrams of the function and effect of the semiconductor device of the fourth embodiment.
Figure 24A:
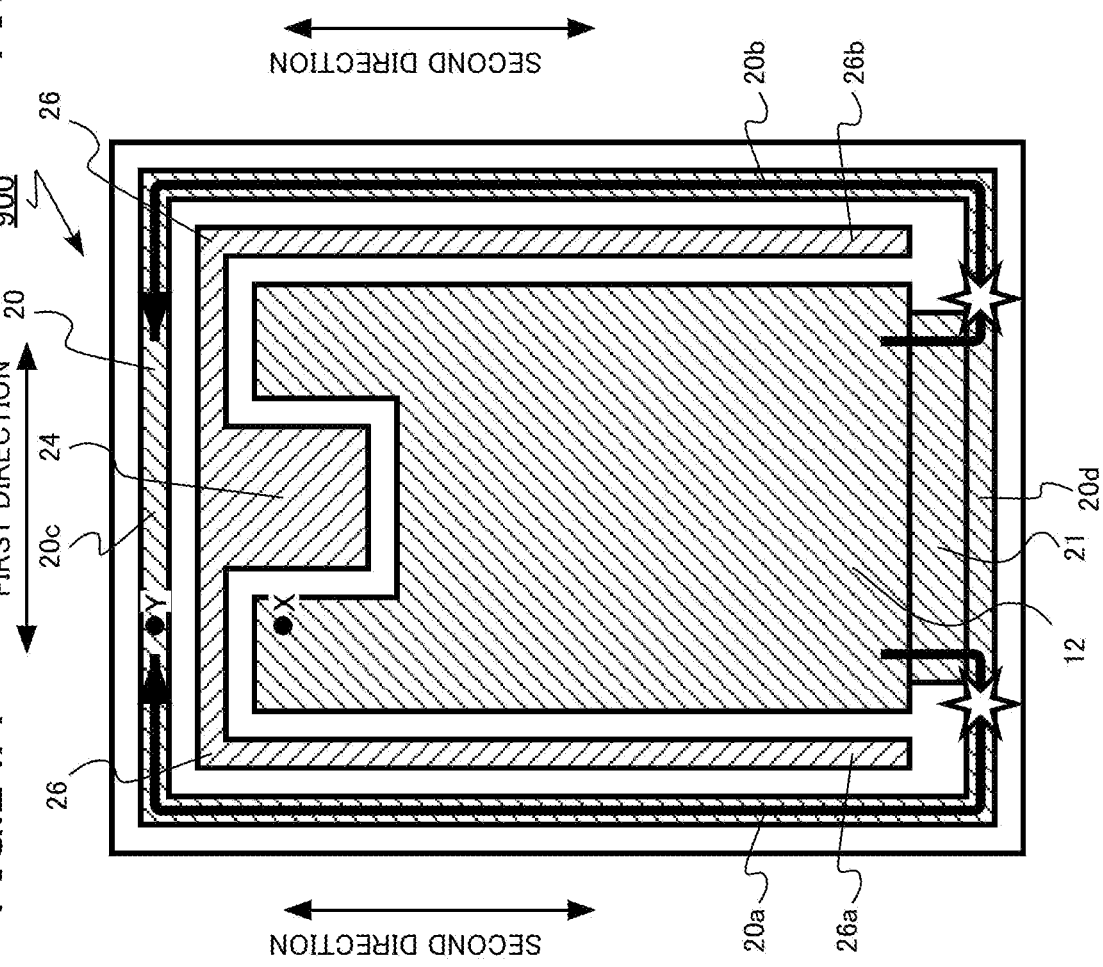

FIGS. 24A and 24B are explanatory diagrams of the function and effect of the semiconductor device of the fourth embodiment. FIG. 24A is a top view of a semiconductor device of a comparative example. FIG. 24B is a top view of the semiconductor device of the fourth embodiment. FIG. 24A is a diagram corresponding to FIG. 10B. FIG. 24B is a diagram corresponding to FIG. 16B.

The semiconductor device of the comparative example is the MOSFET 900 described with reference to FIGS. 10 and 11 in the first embodiment.

In FIG. 24A, the path of a surge current when the surge voltage is applied to the source electrode 12 of the MOSFET 900 is indicated by arrows. In FIG. 24A, breakdown points due to the surge current are indicated by asterisks.

As described in the first embodiment, when a surge voltage that makes the source electrode 12 positive is applied to the MOSFET 900, for example, the operation of the pn junction diode in the vicinity of the second diode D2 below the position Y starts earlier than the pn junction diode in the vicinity of the first diode D1 below the position X. In other words, the pn junction diode below the position Y starts its bipolar operation early, and a large forward current flows through the pn junction diode below the position Y.

Since a large forward current flows through the pn junction diode below the position Y, a large current flows through the first wiring layer 20. When a large current flows through the first wiring layer 20, the current density of a corner portion (asterisk in FIG. 24A) where the first connection layer 21 and the fourth portion 20d are in contact with each other increases. As a result, the amount of heat generated at the corner portion (asterisk in FIG. 24A) where the first connection layer 21 and the fourth portion 20d are in contact with each other increases to fuse the first wiring layer 20. Therefore, the surge current withstand capacity of the MOSFET 900 is reduced.

In the MOSFET 400 of the fourth embodiment, the source electrode 12 serves as the anode of the second diode D2 in the termination region 102. For this reason, the first wiring layer 20 is not necessary.

Therefore, the fusing of the wiring layer when a surge voltage that makes the source electrode 12 positive is applied to the MOSFET 400 does not occur. As a result, the surge current withstand capacity of the MOSFET 400 is improved.

In addition, in the MOSFFT 400, the gate electrode 18 and the gate electrode pad 24 are electrically connected to each other through the gate wiring layer 25. When the electrical resistance of the gate wiring layer 25 increases, for example, the gate signal transmitted between the gate electrode 18 and the gate electrode pad 24 through the gate wiring layer 25 is delayed. If the gate signal is delayed, for example, the switching loss of the MOSFET 400 may increase.

In the MOSFET 400, the electrical resistance per unit length of the gate wiring layer 25 in the second direction is lower than the electrical resistance per unit length of the gate electrode 18 in the first direction. By reducing the electrical resistance of the gate wiring layer 25, the delay of the gate signal is suppressed. Therefore, the increase in the switching loss of the MOSFET 400 is suppressed.

As described above, according to the fourth embodiment, a MOSFET in which the fusing of the wiring layer is suppressed and the surge current withstand capacity is improved is realized.

In the first to fourth embodiments, the case of 4H—SiC has been described as an example of the crystal structure of SiC. However, embodiments can also be applied to devices using SiC having other crystal structures, such as 6H—SiC and 3C—SiC. In addition, a face other than the (0001) face can also be applied as the surface of the silicon carbide layer 10.

In the first to fourth embodiments, the case where the first conductive type is n-type and the second conductive type is p-type has been described as an example. However, the first conductive type can be p-type and the second conductive type can be n-type.

In the first to fourth embodiments, aluminum (Al) is exemplified as a p-type impurity, but boron (B) can also be used. In addition, although nitrogen (N) and phosphorus (P) are exemplified as n-type impurities, arsenic (As), antimony (Sb), and the like can also be applied.

In the first co third embodiments, the case where the gate electrode 18 in the element region 101 has a striped shape has been described as an example. However, for example, the gate electrode 10 may have a mesh-shaped structure.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
an element region including a transistor and a first diode;
a termination region surrounding the element region and including a second diode; and
an intermediate region provided between the element region and the termination region,
wherein the element region includes:
a first electrode;
a second electrode;
a gate electrode;
a silicon carbide layer provided between the first electrode and the second electrode, having a first face on a side of the first electrode and a second face on a side of the second electrode, and including:
a first silicon carbide region of a first conductive type including a first region and a second region, the first region being in contact with the first face and facing the gate electrode, and the second region being in contact with the first face and in contact with the first electrode;
a second silicon carbide region of a second conductive type provided between the first silicon carbide region and the first face, the second silicon carbide region being adjacent to the first region, the second silicon carbide region facing the gate electrode, and the second silicon carbide region electrically connected to the first electrode; and
a third silicon carbide region of a first conductive type provided between the second silicon carbide region and the first face and electrically connected to the first electrode; and
a gate insulating layer provided between the gate electrode and the second silicon carbide region and between the gate electrode and the first region,
the termination region includes:
a first wiring layer electrically connected to the first electrode, the first wiring layer including a first portion, a second portion, a third portion, and a fourth portion, the first portion extending in a second direction perpendicular to a first direction parallel to the first face, the second direction being parallel to the first face, the second portion extending in the second direction, the third portion extending in the first direction, the fourth portion extending in the first direction, the first electrode being interposed between the first portion and the second portion and between the third portion and the fourth portion;
the second electrode; and
the silicon carbide layer including the first silicon carbide region and a fourth silicon carbide region of a second conductive type, the first silicon carbide region including a third region, the third region being in contact with the first face and in contact with the first wiring layer, the fourth silicon carbide region provided between the first silicon carbide region and the first face and electrically connected to the first wiring layer, and
the intermediate region includes:
a gate electrode pad;
a second wiring layer electrically connected to the gate electrode pad and the gate electrode and including a first line and a second line, the first line extending in the second direction and provided between the first portion and the first electrode, and the second line extending in the second direction and provided between the second portion and the first electrode;
the second electrode;
a first connection layer electrically connecting the first electrode and the fourth portion to each other; and
a second connection layer electrically connecting the first electrode and the third portion to each other,
wherein the intermediate region further includes a gate wiring layer provided between the second connection layer and the silicon carbide layer, the gate wiring layer electrically connected to the gate electrode pad and the first line.

2. The semiconductor device according to claim 1,
wherein the transistor includes the gate electrode, the gate insulating layer, the first region, the second silicon carbide region, and the third silicon carbide region,
the first diode includes the first electrode and the second region, and the second diode includes the first wiring layer and the third region.

3. The semiconductor device according to claim 1, wherein the intermediate region does not include the transistor, the first diode, and the second diode.

4. The semiconductor device according to claim 1, wherein the silicon carbide layer in the intermediate region includes the first silicon carbide region and a fifth silicon carbide region of a second conductive type provided between the first silicon carbide region and the first face.

5. The semiconductor device according to claim 1, wherein the intermediate region further includes a third connection layer electrically connecting the first electrode and the first portion to each other.

6. The semiconductor device according to claim 1, wherein the first electrode, the first wiring layer, the first connection layer, the second connection layer, the gate electrode pad, and the second wiring layer contain a same material.

7. A semiconductor device, comprising:
an element region including a transistor and a first diode;
a termination region surrounding the element region and including a second diode; and
an intermediate region provided between the element region and the termination region,
wherein the element region includes:
a first electrode;
a second electrode;
a gate electrode;
a silicon carbide layer provided between the first electrode and the second electrode, having a first face on a side of the first electrode and a second face on a side of the second electrode, and including:
  a first silicon carbide region of a first conductive type including a first region and a second region, the first region being in contact with the first face and facing the gate electrode, and the second region being in contact with the first face and in contact with the first electrode;
  a second silicon carbide region of a second conductive type provided between the first silicon carbide region and the first face, the second silicon carbide region being adjacent to the first region, the second silicon carbide region facing the gate electrode, and the second silicon carbide region electrically connected to the first electrode; and
  a third silicon carbide region of a first conductive type provided between the second silicon carbide region and the first face and electrically connected to the first electrode; and
a gate insulating layer provided between the gate electrode and the second silicon carbide region and between the gate electrode and the first region,
the termination region includes:
a first wiring layer electrically connected to the first electrode, the first wiring layer including a first portion, a second portion, a third portion, and a fourth portion, the first portion extending in a second direction perpendicular to a first direction parallel to the first face, the second direction being parallel to the first face, the second portion extending in the second direction, the third portion extending in the first direction, the fourth portion extending in the first direction, the first electrode being interposed between the first portion and the second portion and between the third portion and the fourth portion;

the second electrode; and
the silicon carbide layer including the first silicon carbide region and a fourth silicon carbide region of a second conductive type, the first silicon carbide region including a third region, the third region being in contact with the first face and in contact with the first wiring layer, the fourth silicon carbide region provided between the first silicon carbide region and the first face and electrically connected to the first wiring layer, and
the intermediate region includes:
a gate electrode pad;
a second wiring layer electrically connected to the gate electrode pad and the gate electrode and including a first line and a second line, the first line extending in the second direction and provided between the first portion and the first electrode, and the second line extending in the second direction and provided between the second portion and the first electrode;
the second electrode;
a first connection layer electrically connecting the first electrode and the fourth portion to each other; and
a second connection layer electrically connecting the first electrode and the third portion to each other,
wherein the second wiring layer is provided between the second connection layer and the silicon carbide layer.

8. A semiconductor device, comprising:
an element region including a transistor and a first diode;
a termination region surrounding the element region and including a second diode; and
an intermediate region provided between the element region and the termination region,
wherein the element region includes:
a first electrode;
a second electrode;
a gate electrode extending in a first direction;
a silicon carbide layer provided between the first electrode and the second electrode, having a first face on a side of the first electrode and parallel to the first direction and a second face on a side of the second electrode, and including:
  a first silicon carbide region of a first conductive type including a first region and a second region, the first region being in contact with the first face and facing the gate electrode, the second region in contact with the first face and in contact with the first electrode;
  a second silicon carbide region of a second conductive type provided between the first silicon carbide region and the first face, the second silicon carbide region being adjacent to the first region, the second silicon carbide region facing the gate electrode, and the second silicon carbide region being electrically connected to the first electrode; and
  a third silicon carbide region of a first conductive type provided between the second silicon carbide region and the first face and electrically connected to the first electrode; and
a gate insulating layer provided between the gate electrode and the second silicon carbide region and between the gate electrode and the first region,
the termination region includes:
the first electrode;
the second electrode; and
the silicon carbide layer including the first silicon carbide region and a fourth silicon carbide region of a second conductive type, the first silicon carbide region including a third region, the third region being in contact with the first face and in contact with the first electrode, the fourth silicon carbide region provided between the first silicon carbide region and the first face and electrically connected to the first electrode, the intermediate region includes:

a gate electrode pad;

the first electrode;

the second electrode;

the silicon carbide layer; and a gate wiring layer provided between the first electrode and the silicon carbide layer, the gate wiring layer electrically connected to the gate electrode pad and the gate electrode, and the gate wiring layer including a first gate line extending in a second direction parallel to the first face and perpendicular to the first direction and a second gate line extending in the second direction, the gate electrode being interposed between the first gate line and the second gate line, and an electrical resistance per unit length of the first gate line in the second direction is lower than an electrical resistance per unit length of the gate electrode in the first direction, wherein in a first cross-section perpendicular to the first face and the first direction, the first electrode in the element region, the first electrode in the intermediate region, and the first electrode in the termination region are physically connected in the second direction, and in a second cross-section perpendicular to the first face and the second direction, the first electrode in the element region, the first electrode in the intermediate region, and the first electrode in the termination region are physically connected in the first direction.

9. The semiconductor device according to claim 8, wherein the transistor includes the gate electrode, the gate insulating layer, the first region, the second silicon carbide region, and the third silicon carbide region, the first diode includes the first electrode and the second region, and the second diode includes the first electrode and the third region.

10. The semiconductor device according to claim 8, wherein the intermediate region does not include the transistor, the first diode, and the second diode.

11. The semiconductor device according to claim 8, wherein the silicon carbide layer in the intermediate region includes the first silicon carbide region and a fifth silicon carbide region of a second conductive type provided between the first silicon carbide region and the first face.

12. The semiconductor device according to claim 8, wherein a width of the first gate line in the first direction is equal to or more than 20 times and equal to or less than 100 times a width of the gate electrode in the second direction.

13. The semiconductor device according to claim 8, wherein a sheet resistance of the first gate line is lower than a sheet resistance of the gate electrode.

14. The semiconductor device according to claim 8, wherein the first gate line is polycrystalline silicon containing n-type impurities, and the gate electrode is polycrystalline silicon containing p-type impurities.

\* \* \* \* \*